(12) United States Patent
Joffe et al.

(10) Patent No.: US 10,797,467 B2
(45) Date of Patent: Oct. 6, 2020

(54) TUNING A MULTI-CHANNEL OPTICAL TRANSMISSION SYSTEM

(71) Applicant: ADTRAN, Inc., Huntsville, AL (US)

(72) Inventors: Daniel M. Joffe, Huntsville, AL (US); Leif Sandstrom, Madison, AL (US)

(73) Assignee: ADTRAN, Inc., Huntsville, AL (US)

( * ) Notice: Subject to any disclaimer, the term of this patent is extended or adjusted under 35 U.S.C. 154(b) by 39 days.

(21) Appl. No.: 16/170,125

(22) Filed: Oct. 25, 2018

(65) Prior Publication Data

US 2020/0136350 A1    Apr. 30, 2020

(51) Int. Cl.
| | |
|---|---|
| *H01S 5/0683* | (2006.01) |
| *H01S 5/00* | (2006.01) |
| *H04B 10/516* | (2013.01) |
| *H01S 5/10* | (2006.01) |
| *H01S 5/06* | (2006.01) |

(52) U.S. Cl.
CPC ........ *H01S 5/06837* (2013.01); *H01S 5/0078* (2013.01); *H01S 5/0612* (2013.01); *H01S 5/1092* (2013.01); *H04B 10/516* (2013.01)

(58) Field of Classification Search
CPC .. H01S 5/06837; H01S 5/1092; H01S 5/0612; H01S 5/0078; H04B 10/516
See application file for complete search history.

(56) References Cited

U.S. PATENT DOCUMENTS

| | | |
|---|---|---|
| 6,188,705 B1 | 2/2001 | Krainak et al. |
| 7,209,498 B1 | 4/2007 | Chapman et al. |
| 7,536,113 B2 | 5/2009 | Matsui et al. |
| 7,542,683 B2 | 6/2009 | Matsui et al. |
| 2005/0071690 A1 | 4/2005 | Abbink et al. |

(Continued)

FOREIGN PATENT DOCUMENTS

WO    WO 01/08331    2/2001

OTHER PUBLICATIONS

Mahgerefteh, "Chirp Managed Laser (CML) and Applications," PowerPoint presented at the Institute for Energy Efficiency, Santa Barbara California, Mar. 23, 2011, Finsar Corporation, May 4, 2007.

(Continued)

*Primary Examiner* — Yuanda Zhang
(74) *Attorney, Agent, or Firm* — Fish & Richardson P.C.

(57) ABSTRACT

An optical transmission system includes a laser module generating a modulated optical waveform, including both amplitude and frequency modulation, at center frequencies corresponding to different operating temperatures; and an optical shaping filter, with passbands corresponding to the different center frequencies, that converts at least part of the frequency modulation to additional amplitude modulation. The optical transmission system is tuned by: determining a range of temperatures at which the laser module center frequencies are within a passband of the optical shaping filter; setting the laser module to a temperature, within the range of temperatures, at which the modulated optical waveform is within the passband; measuring an average output power of the optical shaping filter; and adjusting the temperature of the laser module to a target temperature, within the range of temperatures, at which an output condition is achieved, based on the average output power and/or extinction ratio of the filtered waveform.

18 Claims, 8 Drawing Sheets

(56) References Cited

U.S. PATENT DOCUMENTS

| | | | |
|---|---|---|---|
| 2005/0169638 A1 | 8/2005 | Tayebati et al. | |
| 2005/0169642 A1 | 8/2005 | Mahgerefteh et al. | |
| 2006/0078338 A1* | 4/2006 | Johnson | H04B 10/504 398/187 |
| 2007/0012860 A1* | 1/2007 | Mahgerefteh | H01S 5/0687 250/205 |
| 2008/0025731 A1* | 1/2008 | Mahgerefteh | H04B 10/505 398/185 |
| 2008/0158639 A1* | 7/2008 | McCallion | G02B 6/14 359/238 |
| 2008/0166134 A1* | 7/2008 | McCallion | G02B 6/12007 398/187 |
| 2008/0181272 A1 | 7/2008 | Miller | |
| 2009/0003842 A1* | 1/2009 | Mahgerefteh | H04B 10/5162 398/187 |
| 2012/0087655 A1 | 4/2012 | Neilson et al. | |
| 2016/0134079 A1* | 5/2016 | Liao | H01S 5/0078 398/38 |

OTHER PUBLICATIONS

Mahgerefteh et al., "Chirp Managed Laser and Applications," IEEE Journal of Selected Topics in Quantum Electronics. Sep./Oct. 2010, 16(5):1126-39.

PCT International Search Report and Written Opinion in International Application No. PCT/US2019/051485, dated Dec. 4, 2019, 9 pages.

* cited by examiner

TUNING A MULTI-CHANNEL OPTICAL TRANSMISSION SYSTEM

BACKGROUND

This document relates to optical telecommunications apparatus and methods. Data networks are being deployed and/or upgraded to provide subscribers with access to digital content. In some situations, the entities deploying these data networks will initially install network components that provide a certain level of service (e.g., speed) that is currently desired by their subscribers, and those entities will later determine whether to replace the initially installed network components to provide a higher level of service (e.g., higher speed).

SUMMARY

In general, one innovative aspect of the subject matter described in this specification can be embodied in optical transmission systems that include a laser module configured to generate a modulated optical waveform at any one of a plurality of center frequencies corresponding to a plurality of operating temperatures of the laser module, the modulated optical waveform including both amplitude modulation and frequency modulation; an optical shaping filter that is configured to implement a plurality of passbands corresponding to the center frequencies of the modulated optical waveform, and that is configured to convert at least part of the frequency modulation in the modulated optical waveform to additional amplitude modulation for the modulated optical waveform; and a controller including at least one processor configured to tune the optical transmission system by performing operations that include: for a first passband among the plurality of passbands of the optical shaping filter, determining a first range of temperatures at which the laser module generates the modulated optical waveform at center frequencies that are within the first passband; setting the laser module to a first temperature, within the first range of temperatures, at which the laser module generates the modulated optical waveform at a first center frequency that is within the first passband; measuring, based on an amplitude of a first filtered optical waveform that is output from the optical shaping filter, an average output power of the optical shaping filter; and adjusting the first temperature of the laser module to a target temperature, within the first range of temperatures, at which a target output condition is achieved, including: adjusting the first temperature of the laser module to a first target temperature, within the first range of temperatures, at which the average output power of the first filtered optical waveform that is output from the optical shaping filter satisfies a first output criteria, or adjusting the first temperature of the laser module to a second target temperature, within the first range of temperatures, at which the output power and extinction ratio of the first filtered optical waveform that is output from the optical shaping filter satisfy a second output criteria. Other embodiments of this aspect include corresponding systems, methods, and computer programs recorded on one or more computer storage devices, each configured to cause at least one operably connected processor to perform the actions of the methods.

These and other embodiments can each optionally include one or more of the following features. The optical transmission system where the operations further include: for a second passband among the plurality of passbands of the optical shaping filter, determining a second range of temperatures at which the laser module generates the modulated optical waveform at center frequencies that are within the second passband; adjusting the laser module from the first temperature to a second temperature, within the second range of temperatures, at which the laser module generates the modulated optical waveform at a second center frequency that is within the second passband; measuring, based on an amplitude of a second filtered optical waveform that is output from the optical shaping filter, an average output power of the optical shaping filter; and adjusting the second temperature of the laser module to a target temperature, within the second range of temperatures, at which the average output power of the second filtered optical waveform that is output from the optical shaping filter satisfies the target output condition. The optical transmission system where the laser module includes a directly modulated laser that is tunable over a range of frequencies that includes the plurality of passbands of the optical shaping filter, and where the optical shaping filter is a bandpass filter configured to limit an operating bandwidth of the modulated optical waveform. The optical transmission system where the optical transmission system further includes an optical transmitter that is configured to modulate an electrical signal that drives the laser module to generate the modulated optical waveform. The optical transmission system where adjusting the first temperature of the laser module to the first target temperature or to the second target temperature includes: determining a rate of change of the output power with respect to the first center frequency or with respect to the first temperature of the laser module; and adjusting the first temperature of the laser module to the first target temperature or to the second target temperature at which the rate of change of the output power satisfies a first condition or a second condition, respectively. The optical transmission system where adjusting the first temperature of the laser module to the target temperature, within the first range of temperatures, at which the target output condition is achieved includes: determining a reference temperature for the laser module, within the first range of temperatures, at which (i) the average output power of the optical shaping filter is maximized at a maximum average output power, or (ii) a specified extinction ratio is achieved and the average output power is within a specified amount of the maximum average output power. The optical transmission system where determining the reference temperature for the laser module, within the first range of temperatures, at which the average output power of the optical shaping filter is maximized includes: determining, for a plurality of temperatures of the laser module within the first range of temperatures, a corresponding plurality of average output powers from the optical shaping filter; and selecting, from among the plurality of temperatures, the reference temperature as corresponding to (i) a maximum average output power among the plurality of average output powers, or (ii) an average output power among the plurality of average output powers that is within the specified amount of the maximum average output power, and at which the specified extinction ratio is achieved. The optical transmission system where the operations further include: setting the first temperature of the laser module to be offset from the reference temperature such that a modulation frequency of a first modulation level in the modulated optical waveform is less than 5 GHz away from a center of the first passband of the optical shaping filter. The optical transmission system where the operations further include: based on adjusting the first temperature of the laser module to the target temperature, within the first range of temperatures, at which the target output condition is achieved, further applying a temperature dither signal to the laser module to offset the first temperature of the laser module; measuring, based on an updated first filtered optical waveform that is output from the optical shaping filter, an updated average output power of the optical shaping filter; and adjusting the first temperature of the laser module to an updated first temperature at which the updated average output power of the optical shaping filter satisfies the target output condition. The optical transmission system where the laser module is further configured to generate the modulated optical waveform having a first modulation frequency and a second modulation frequency, and where the operations further include: initializing the temperature of the laser module to an initial temperature at which the first modulation frequency of the laser module is aligned with the optical shaping filter, based on a center frequency of the first passband of the optical shaping filter.

All or part of the features described throughout this application can be implemented as a computer program product including instructions that are stored on one or more non-transitory machine-readable storage media, and that are executable on one or more processing devices. All or part of the features described throughout this application can be implemented as an apparatus, method, or electronic system that can include one or more processing devices and memory to store executable instructions to implement the stated functions.

The details of one or more embodiments of the subject matter described in this specification are set forth in the accompanying drawings and the description below. Other features, aspects, and advantages of the subject matter will become apparent from the description, the drawings, and the claims.

DETAILED DESCRIPTION

Figure 1:
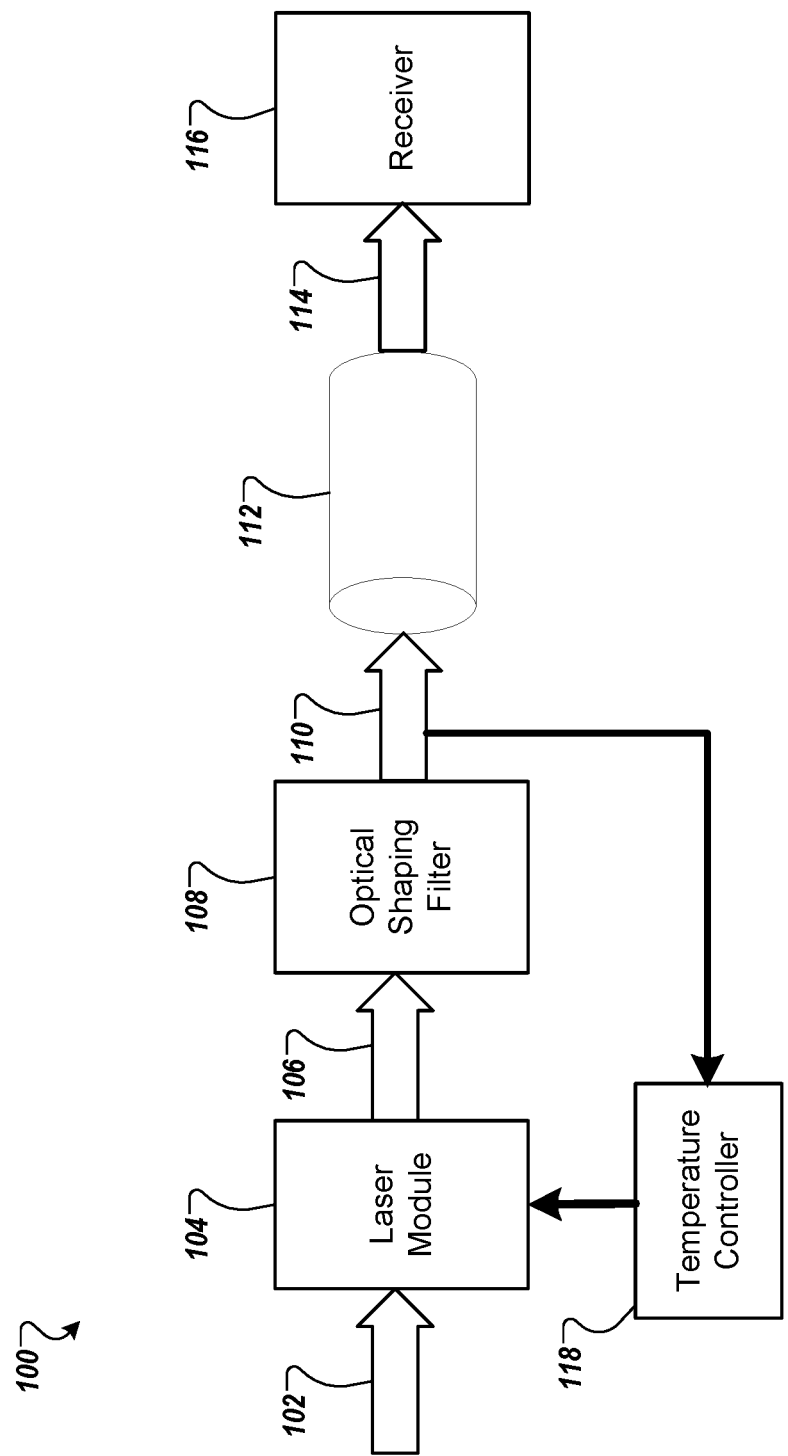
FIG. 1 is a block diagram of an example multi-channel optical communication environment.

The subject matter described in this document relates to optical telecommunications systems, devices, and methods that provide tuning for a multi-channel optical transmission system. The multi-channel optical transmission system is configured to support multiple different wavelength channels, for example in wavelength division multiplexing (WDM) scenarios where a number of optical carriers at different wavelengths are multiplexed onto a single optical communication medium. The multi-channel optical transmission system can switch between transmitting information over the different wavelength channels.

In some implementations, a multi-channel optical transmission system includes a laser module that generates a modulated optical waveform at one of multiple different possible wavelengths (carrier frequencies), and also includes an optical shaping filter with multiple passbands corresponding to the different carrier frequencies. The optical shaping filter is designed to convert frequency modulation components that are present in the modulated waveform emitted by the laser module into additional amplitude modulation for the waveform. As such, the optical shaping filter can provide various performance advantages, including improved extinction ratio and diminished effects of frequency chirp on dispersion. By aligning the frequency response characteristics of the multiple passbands of the optical shaping filter with the multiple possible carrier frequencies of the laser module, the optical transmission system can ensure that each wavelength channel is able to leverage these advantages. In particular, the optical transmission system may be configured so as to maintain alignment between the multiple passbands of the optical shaping filter and the multiple possible carrier frequencies of the laser module, despite effects of aging and temperature variations in the optical transmission system.

In some implementations, the tuning of a multi-channel optical transmission system as disclosed herein may have the advantage of being configured to be performed according to simple and convergent techniques that maintain the critical frequencies of the multiple passband optical shaping filter aligned with multiple possible carrier frequencies of the laser module. In some scenarios, implementations disclosed herein enable limiting changes in the extinction ratio of a transmitted optical waveform that would otherwise be caused by frequency drift as the optical waveform propagates through transmission media.

In some scenarios, implementations disclosed herein enable such multi-channel operation with a reduced number of moving parts to switch between different wavelength channels, thus simplifying the design and reducing the size of the transmitter, and reducing the risk of malfunction. At the same time, implementations disclosed herein enable improved tuning techniques that provide performance enhancements such as high extinction ratios and protection against effects of aging and external ambient temperature variations. As such, a multi-channel optical transmitter according to implementations disclosed herein enable simpler, more effective, and more consistent multi-channel operation in optical communication systems.

FIG. 1 is a block diagram of an example multi-channel optical communication environment 100. In this example, an input signal 102 is input into a laser module 104, which outputs a modulated optical waveform 106. In some implementations, the laser module 104 may include a directly modulated laser. The input signal 102 may be any suitable type of modulated signal that causes the laser module 104 to generate the modulated optical waveform 106. For example, in some implementations, the input signal 102 may be a modulated electrical signal that includes information to be transmitted through the optical communication environment 100.

The laser module 104 may be configured to generate the modulated optical waveform 106 at any one of multiple center frequencies corresponding to multiple wavelength channels. The laser module 104 may be configured to switch between the different center frequencies by adjusting a temperature of the laser module 104, with each temperature corresponding to a particular center frequency of the modulated optical waveform 106 that is generated.

At each one of these multiple center frequencies, the laser module 104 may output the modulated optical waveform 106 with various modulation levels. For example, at a particular center frequency (wavelength channel), the modulated optical waveform 106 may have two modulation levels, corresponding to an information "0" and an information "1." In the scenario of amplitude modulation, the modulation levels correspond to different amplitude levels in the modulated optical waveform 106. In the scenario of frequency modulation, the modulation levels of the modulated optical waveform 106 correspond to different frequency components in the modulated optical waveform 106. In general, the laser module 104 generate the modulated optical waveform 106 with any suitable number of modulation levels representing any suitable type of information.

The modulated optical waveform 106 is then input into an optical shaping filter 108, which performs frequency-selective filtering on the modulated optical waveform 106. The optical shaping filter 108 may be designed with multiple band-pass regions, corresponding to the multiple center frequencies that are generated in the modulated optical waveform 106. As such, by aligning the multiple center frequencies of the laser module 104 with the multiple bandpass points of the optical shaping filter 108, the optical transmission system 100 provides transmission on different wavelength channels.

The output of the optical shaping filter 108 is a filtered optical waveform 110, which is transmitted over a communication channel 112. The communication channel 112 may be any suitable optical transmission medium. After propagating through the communication channel 112, the waveform is received as a received optical waveform 114 by an optical receiver 116.

The optical shaping filter 108 may be designed to perform filtering on the modulated optical waveform 106 that results in a filtered optical waveform 110 having characteristics that improve the performance of communication over the communication channel 112, as compared to transmitting the modulated optical waveform 106 by itself. For example, in the scenario of a system designed to perform amplitude-modulated communication, the optical shaping filter 108 may be configured to convert incidental frequency modulation that is present in the modulated optical waveform 106 into additional amplitude modulation. Such incidental frequency modulation may be present in the modulated optical waveform 106, for example, due to effects of frequency chirp, which can be caused by various non-idealities in the physical transmission, such as chromatic dispersion, non-linearities, or refractive index changes.

For example, if the modulated optical waveform 106 is generated by the laser module 104 to be amplitude modulated (e.g., the waveform 106 having a first amplitude representing information "0" and a second amplitude representing information "1"), then effects of frequency chirp may cause variations in the frequency profile of the modulated optical waveform 106 such that a "0" pulse and a "1" pulse are shifted to different frequencies. This can introduce incidental frequency modulation, as the information "0" is carried at a frequency that is different from a frequency at which the information "1" is carried.

To mitigate such frequency distortion, the optical shaping filter 108 may be designed to convert incidental frequency modulation (e.g., caused by frequency chirp) in the modulated optical waveform 106 into additional amplitude modulation for the modulated optical waveform 106. As a result, the output of the optical shaping filter 108, namely the filtered optical waveform 110 in FIG. 1, may have improved extinction ratio and diminished effects of frequency chirp. To achieve this, the optical shaping filter 108 may be designed to have critical frequencies that are aligned with the output of the laser module 104. In particular, the laser module 104 may be configured to be thermally tuned so that the "1" frequency on different carrier frequencies is centered on the different bandpass points of the optical shaping filter 108 to provide transmission on the different wavelength channels. Further details of the alignment of the optical shaping filter 108 with the laser module 104 are discussed with reference to FIGS. 2 and 3A to 3C, below.

To help ensure that the optical shaping filter 108 maintains proper alignment with the laser module 104, and therefore performs the desired filtering operation, a feedback control system may be implemented that tunes the transmission system to ensure maintaining proper operation. In the example of FIG. 1, a temperature controller 118 controls a temperature of the laser module 104 based on feedback information regarding the filtered optical waveform 110 that is output from the optical shaping filter 108. The temperature controller 118 controls the temperature of the laser module 104 so as to maintain a desired relationship between the multiple center frequencies of the laser module 104 and multiple passband regions of the optical shaping filter 108. As described further below with reference to FIGS. 2 and 3A to 3C, such feedback control may be achieved by using an efficient and convergent tuning technique that helps ensure proper alignment between the laser module 104 and the optical shaping filter 108. Through such control, the laser module 104 may be tuned so as to maintain desired output characteristics in the filtered optical waveform 110 despite changes to the optical communication environment 100 caused by aging and/or caused by variations in the ambient temperature.

Figure 2:
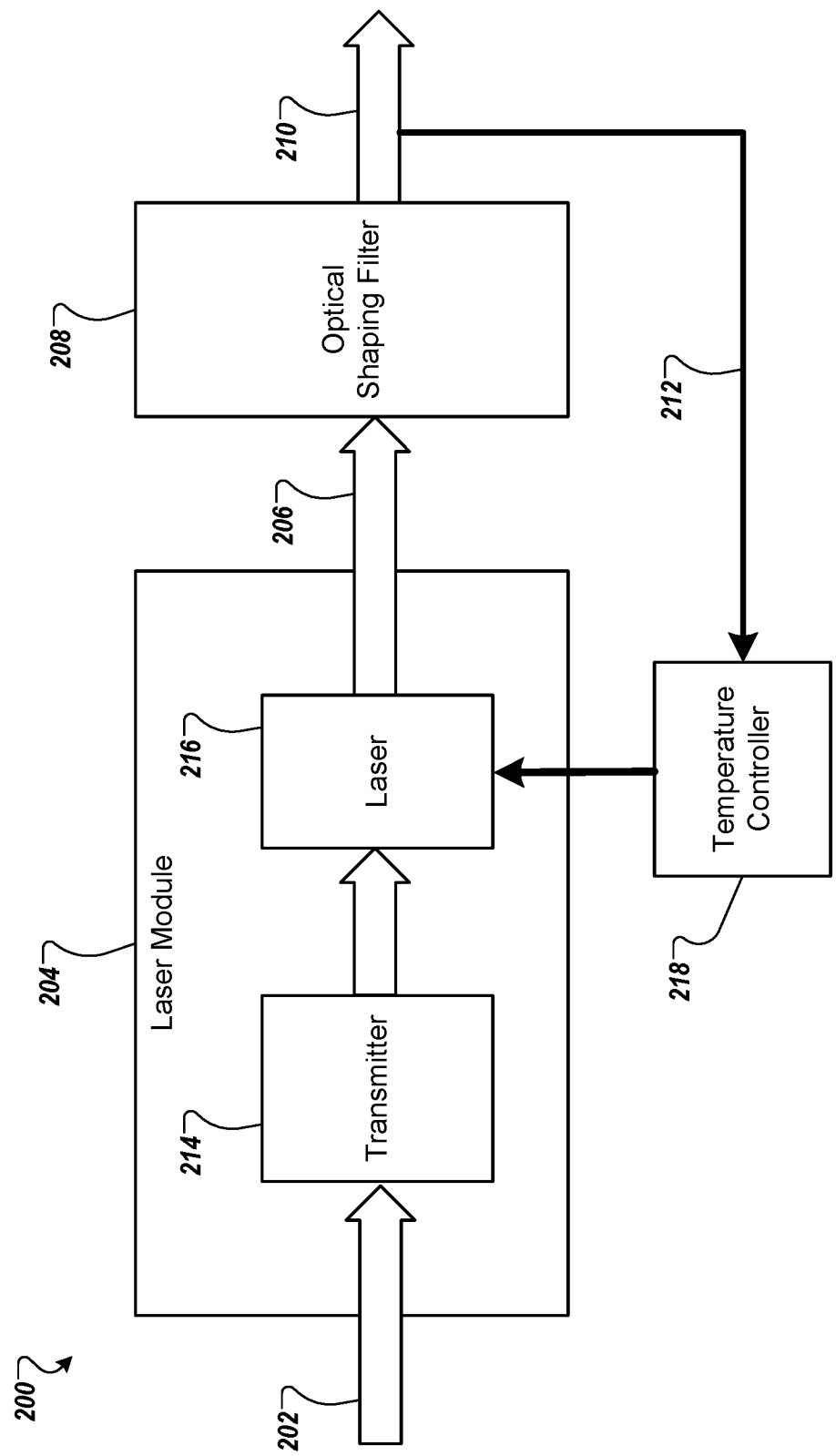
FIG. 2 is a block diagram of an example multi-channel optical transmission system.

FIG. 2 is a block diagram of an example multi-channel optical transmission system 200. The optical transmission system 200 includes a laser module 204, an optical shaping filter 208, and a temperature controller 218, which may be implementations of the laser module 104, the optical shaping filter 108, and the temperature controller 118 in FIG. 1.

In the optical transmission system 200, the laser module 204 includes an optical transmitter 214 and a laser 216 (e.g., a laser diode). The optical transmitter 214 receives an input signal 202, and uses the input signal 202 to drive the laser 216, which outputs a modulated optical waveform 206 at one of multiple possible center frequencies, corresponding to different wavelength channels. For example, given a particular center frequency among the multiple center frequencies, the optical transmitter 214 may be designed to drive the laser 216 to generate the output modulated optical waveform 206 that is amplitude-modulated with specified characteristics, such as a specified extinction ratio between amplitude-modulated levels of the waveform 206. However, in such scenarios, the modulated optical waveform 206 may also contain, in addition to amplitude modulation, incidental frequency-modulated components. Such incidental frequency modulation may be caused by effects such as frequency chirp, which causes signal components in the modulated optical waveform 206 to drift, i.e., increase or decrease, in frequency.

As an example, during the course of manufacturing, the laser 216 (e.g., a laser diode) in the laser module 204 may be designed to generate a binary amplitude-modulated optical waveform 206 having a specified extinction ratio (e.g., 4 dB) using two input currents that are sufficiently above a threshold, which may help ensure fast operation and adequate output power. The temperature of the laser 216 may be adjusted so that the frequency of the amplitude-modulated "1" component of the modulated optical waveform 206 is set to a desired frequency. Then in such scenarios, the frequency of the amplitude-modulated "0" component of the modulated optical waveform 206 may be some frequency distance away (e.g., some number of GHz lower) than the frequency of the amplitude-modulated "1" component, due to effects of frequency chirp. As a result, the modulated optical waveform 206 will have both the original amplitude modulation as well as incidental frequency modulation caused by frequency chirp. Such frequency chirp may affect each of the different center frequencies generated by the laser 216, resulting in incidental frequency modulation being present in each of the wavelength channels generated by the laser module 204.

The modulated optical waveform 206 is then input into the optical shaping filter 208, which performs filtering and outputs a filtered optical waveform 210. In some implementations, the optical shaping filter 208 may be a bandpass filter that is configured to limit an operating bandwidth of the modulated optical waveform 206. For example, the optical shaping filter 208 may include multiple passband regions corresponding to different wavelength channels of the optical transmission system 200. Each passband region of the optical shaping filter 208 has a certain passband width and is spaced apart from other passband regions. As an example, in some implementations, the wavelength channels corresponding to the different passband regions may be separated by 100 GHz, or by any other suitable distance in frequency that is appropriate for various communication scenarios.

The modulated optical waveform 206 may be generated by the laser module 204 at a particular center frequency, among multiple center frequencies that can be generated by the laser module 204, which corresponds to a particular passband region, among the multiple passband regions, of the optical shaping filter 208. As such, the laser module 204 and the optical shaping filter 208 may be configured to provide multiple wavelength channels, and the laser module 204 may be configured to switch between those different wavelength channels. Implementations disclosed herein may thus enable a more efficient, stable, and consistent technique of tuning the laser modular 204 and switching between different wavelength channels, that mitigates effects of aging and temperature variations.

As discussed with reference to FIG. 1, above, and as further detailed below, if the modulated optical waveform 206 includes both amplitude modulation and frequency modulation (e.g., amplitude modulation with incidental frequency modulation that is caused by frequency chirp), then the optical shaping filter 208 may convert at least a portion of the incidental frequency modulation that is present in the modulated optical waveform 206 into additional amplitude modulation in the resulting filtered optical waveform 210.

In some implementations, the optical transmission system 200 may be initially configured to align the critical frequencies of the multiple passband regions of the optical shaping filter 208 with the multiple center frequencies of the modulated optical waveform 206 that may be output from the laser module 204 by controlling an angle between and the optical shaping filter 208 and the laser module 204 to be adjusted by small variations. In some implementations, the modulated optical waveform 206 may include amplitude modulation. In such scenarios, for a particular center frequency among multiple possible center frequencies, a frequency of the "1" component of the modulated optical waveform 206 that is output from the laser module 206 may be aligned with the center of a corresponding passband region, among multiple passband regions, of the optical shaping filter 208. Such alignment may result in minimum attenuation for the "1" component of the modulated optical waveform 206. The frequency of the "0" component of the modulated optical waveform 206 (which may be frequency-shifted due to incidental frequency modulation, e.g., caused by frequency chirp) may then be aligned to correspond to a periphery of the passband region of the optical shaping filter 208, and therefore may undergo more attenuation.

As a result of such alignment between the laser module 204 and the optical shaping filter 208, the filtered optical waveform 210 that is output from the optical shaping filter 208 has an increased extinction ratio that is approximately larger (as compared to the modulated optical waveform 206) by the ratio of the gains at the "1" and "0" frequencies that were induced by the optical shaping filter 208. The improved extinction ratio in the filtered optical waveform 210 can provide improved communication performance by helping a receiver (e.g., receiver 116 in FIG. 1) better distinguish between amplitude-modulated "1" and "0" signals.

Such alignment may be performed between each of the multiple center frequencies of the modulated optical waveform 206 and a corresponding passband among the multiple passband regions of the optical shaping filter 208. As such, in the multi-channel optical transmission system 200, each of the different wavelength channels may be designed to have high extinction ratio and diminished chirp by performing such aligning.

However, the alignment between the laser module 204 and optical shaping filter 208 described above may change over time, due to effects of aging and/or temperature variations in the optical transmission system 200. To help ensure that the alignment is maintained, a feedback control system may be implemented that adaptively tunes the laser module 204 to maintain proper alignment between the multi-channel output of the laser module 204 and the multi-channel optical shaping filter 208.

For example, in FIG. 2, information regarding the resulting filtered optical waveform 210 may be provided as feedback information 212 to a controller, such as temperature controller 218. The temperature controller 218 analyzes the feedback information 212 and adjusts the temperature of the laser module 204 based on the information regarding the filtered optical waveform 210. By adjusting the temperature of the laser module 204, the temperature controller 218 changes the frequency characteristics of the modulated optical waveform 206 (relative to the optical shaping filter 208), which in turn changes the filtered optical waveform 210 that is output from the optical shaping filter 208.

As an example, the optical transmission system 200 may be configured such that, for a first passband among the multiple passbands of the optical shaping filter 208 (i.e., for a first wavelength channel among the multiple channels of system 200), a first range of temperatures is determined at which the laser module 204 generates the modulated optical waveform 206 at center frequencies that are within the first passband of the optical shaping filter 208. The system 200

(e.g., the temperature controller 218) may then set the laser module 204 to a first temperature, within this first range of temperatures, to generate the modulated optical waveform 206 at a first center frequency that is within the first passband of the optical shaping filter 208. This ensures that the center frequency of the modulated optical waveform 206 that is output from the laser module 204 is within the corresponding passband of the optical shaping filter 208 for a desired wavelength channel.

Once the laser module 204 is tuned to be within the desired passband of the optical shaping filter 208, further tuning may be performed to better align the frequency characteristics of the modulated optical waveform 206 with the optical shaping filter 208 to achieve various improvements. In some implementations, the system 200 (e.g., the temperature controller 218) may measure, based on an amplitude of a filtered optical waveform 210 that is output from the optical shaping filter 208, an average output power of the optical shaping filter 208.

In particular, the system 200 (e.g., the temperature controller 218) may adjust the temperature of the laser module 204, within the first range of temperatures corresponding to the first wavelength channel, so that the filtered optical waveform 210 satisfies one or more output criteria. For example, in some implementations, the temperature controller 218 measures an average output power of the optical shaping filter 208, based on the filtered optical waveform 210 that is output from the optical shaping filter 208. The temperature controller 218 then adjusts a temperature of the laser module 204, within the first range of temperatures, so that the output of the optical shaping filter 208 satisfies the output criteria.

For example, the output criteria that the temperature controller 218 strives to achieve may be that the average output power of the optical shaping filter 208 satisfies first output criteria for the first wavelength channel. Then the temperature controller 218 would adjust the temperature of the laser module 204 to a first target temperature, within the first range of temperatures corresponding to the first wavelength channel, at which the average output power of the filtered optical waveform 210 that is output from the optical shaping filter 206 satisfies the first output criteria. In some implementations, the first output criteria may be maximizing the average output power of the optical shaping filter 208, or may be achieving an average output power that is slightly below maximum.

As another example, the output criteria that the temperature controller 218 strives to achieve may be that the average output power and the extinction ratio of the filtered optical waveform 210 that is output from the optical shaping filter 208 satisfy second output criteria. In some implementations, the second output criteria may be that a specified extinction ratio is achieved and that the average output power is within a specified range of the maximum average output power, based on a change in the average output power with operating frequency In some implementations, the temperature controller 218 may determine a reference temperature for the laser module 204, within the first range of temperatures corresponding to the first wavelength channel, at which (i) the average output power of the optical shaping filter 208 is maximized at a maximum average output power, or (ii) a specified extinction ratio is achieved and the average output power is within a specified amount of the maximum average output power.

In such implementations, the temperature controller 218 may determine the reference temperature for the laser module 204 at which the average output power of the optical shaping filter 208 is maximized by various techniques. For example, the temperature controller 218 may determine, for a plurality of temperatures of the laser module 204, within the first range of temperatures, a corresponding plurality of average output powers from the optical shaping filter 208. The temperature controller 218 may then select, from among the plurality of temperatures, the reference temperature as corresponding to (i) a maximum average output power among the plurality of average output powers, or (ii) an average output power among the plurality of average output powers that is within the specified amount of the maximum average output power, and at which the specified extinction ratio is achieved.

Once the reference temperature is determined, the temperature controller 218 may set the temperature of the laser module 204 to be the reference temperature, or may set the temperature of the laser module 204 to be offset from the reference temperature by a certain temperature difference, within the first range of temperatures for the first wavelength channel. As a result of controlling the temperature, the frequency properties of the modulated optical waveform 206 may be controlled and aligned relative to the filtering frequencies of the optical shaping filter 208 within the first passband among the multiple passbands.

For example, the maximum average output power from the optical shaping filter 208 (achieved at the reference temperature) may correspond to a frequency of a "1" modulation level of the modulated optical waveform being aligned with the center of a particular passband region, among multiple passband regions, of the optical shaping filter 208. In such scenarios, the temperature controller 218 may set the temperature of the laser module 204 to be offset from the reference temperature such that a frequency of a first modulation level (e.g., a the "1" modulation component) in the modulated optical waveform 206 is offset from a center of the particular passband region of the optical shaping filter 208. For example, in some implementations, the offset in frequency from the center of the particular passband region of the optical shaping filter 208 may be less than 5 GHz. In some implementations, the offset in frequency from the center of the passband region of the optical shaping filter 208 may be less than 1 GHz (or some other appropriate/specified offset).

As such, for a given wavelength channel, the alignment between the frequency properties of the modulated optical waveform 206 and the optical shaping filter 208 may be achieved by analyzing the average output power of the optical shaping filter 208.

Once aligned, to help ensure that the optical transmission system 200 remains tuned, in some implementations, the temperature controller 218 may further apply a temperature dither signal to the temperature of the laser module 204, within the first range of temperatures, and perform re-alignment. In particular, the temperature controller 218 may measure, based on an updated filtered optical waveform 210 that is output from the optical shaping filter 208 after applying the temperature dither signal to the laser module 204, an updated average output power of the optical shaping filter 208. The temperature controller 218 may then adjust the temperature of the laser module 204 to a second temperature, within the first range of temperatures for the first wavelength channel, at which the updated average output power of the optical shaping filter 208 satisfies the same output criteria as described before.

As such, for a given wavelength channel, by monitoring the output of the optical shaping filter 208 and adjusting the temperature of the laser module 204 such that the output of the optical shaping filter 208 achieves specified output criteria in the manner described above, the optical transmission system 200 enables maintaining the optical transmission system to be tuned to achieve various performance enhancements, such as improved extinction ratio and diminished effects of frequency chirp.

The tuning process described above may be performed for any one of multiple wavelength channels that are provided in the multi-channel optical transmission system 200. In some implementations, different wavelength channels may be tuned in an efficient manner by appropriately adjusting the temperature of the laser module 204 to switch between different wavelength channels, and then performing the tuning steps disclosed above for each wavelength channel.

As an example, once tuning has been performed for a first wavelength channel, as described above, then tuning may be efficiently performed for a second wavelength channel. In particular, for a second passband among the multiple passbands of the optical shaping filter 208, the system 200 may determine a second range of temperatures at which the laser module 204 generates the modulated optical waveform 206 at center frequencies that are within the second passband of the optical shaping filter 208.

The system 200 (e.g., the temperature controller 218) may then adjust the laser module 204 from the first temperature (described above) to a second temperature, within the second range of temperatures corresponding to the second wavelength channel, at which the laser module 204 generates the modulated optical waveform 206 at a second center frequency that is within the second passband of the optical shaping filter 208. As such, optical transmission system 200 is able to switch efficiently between different wavelength channels by adjusting the temperature of the laser module 204.

Each wavelength channel of the system 200 (e.g., each passband region of the optical shaping filter 208) may correspond to a different range of temperatures within which the laser module 204 generates the modulated optical waveform 206 to be within that wavelength channel (i.e., within the corresponding passband of the optical shaping filter 208). In some implementations, information regarding these different ranges of temperatures may be stored in a memory storage device and accessed by the temperature controller 218 to determine an appropriate range of temperatures within which to tune the laser module 204 for a desired wavelength channel. The information regarding the different ranges of temperatures may be updated over time, for example based on the feedback information 212, to maintain accurate switching between wavelength channels.

Once the laser module 204 is set to the second temperature so as to output the modulated optical waveform 206 within the second passband (the second wavelength channel) of the optical shaping filter 208, further tuning may be performed to better align the laser module 204 with the optical shaping filter 208 and further enhance performance. Such tuning may be similar to the tuning operations that were described above with reference to the first wavelength channel. In particular, the system 200 (e.g., the temperature controller 218) may measure, based on an amplitude of the filtered optical waveform 210 that is output from the optical shaping filter 208, an average output power of the optical shaping filter 208.

The temperature controller 218 may then adjust the second temperature of the laser module to a target temperature, within the second range of temperatures for the second wavelength channel, at which the average output power of the filtered optical waveform 210 that is output from the optical shaping filter 208 satisfies various output criteria. The output criteria may be the same criteria as described above with reference to tuning for the first wavelength channel.

For example, as described above with reference to the first wavelength channel, the output criteria that the temperature controller 218 strives to achieve for the second wavelength channel may be that the average output power of the optical shaping filter 208 satisfies first output criteria. Then the temperature controller 218 would adjust the temperature of the laser module 204 to a first target temperature, within the second range of temperatures, at which the average output power of the filtered optical waveform 210 that is output from the optical shaping filter 206 satisfies the first output criteria. In some implementations, the first output criteria may be maximizing the average output power of the optical shaping filter 208, or may be achieving an average output power that is slightly below maximum for the second wavelength channel.

As another example, and again similar to the process described above with reference to the first wavelength channel, the output criteria that the temperature controller 218 strives to achieve for the second wavelength channel may be that the average output power and the extinction ratio of the filtered optical waveform 210 that is output from the optical shaping filter 208 satisfy second output criteria. In some implementations, the second output criteria may be that a specified extinction ratio is achieved and that the average output power is within a specified range of the maximum average output power, based on a change in the average output power with operating frequency.

In some implementations, the temperature controller 218 may determine a reference temperature for the laser module 204, within the second range of temperatures for the second wavelength channel, at which (i) the average output power of the optical shaping filter 208 is maximized at a maximum average output power, or (ii) a specified extinction ratio is achieved and the average output power is within a specified amount of the maximum average output power.

In such implementations, the temperature controller 218 may determine the reference temperature for the laser module 204 at which the average output power of the optical shaping filter 208 is maximized by various techniques. For example, the temperature controller 218 may determine, for a plurality of temperatures of the laser module within the second range of temperatures for the second wavelength channel, a corresponding plurality of average output powers from the optical shaping filter 208. The temperature controller 218 may then select, from among the plurality of temperatures, the reference temperature as corresponding to (i) a maximum average output power among the plurality of average output powers, or (ii) an average output power among the plurality of average output powers that is within the specified amount of the maximum average output power, and at which the specified extinction ratio is achieved.

Once the reference temperature is determined, the temperature controller 218 may set the temperature of the laser module 204 to be the reference temperature, or may set the temperature of the laser module 204 to be offset from the reference temperature by a certain temperature difference, within the second range of temperatures. As a result of controlling the temperature, the frequency properties of the modulated optical waveform 206 may be controlled and aligned relative to the filtering frequencies of the optical shaping filter 208.

For example, the maximum average output power from the optical shaping filter 208 (achieved at the reference temperature) may correspond to a frequency of a "1" modulation level of the modulated optical waveform being aligned with the center of a particular passband region, among multiple passband regions, of the optical shaping filter 208. In such scenarios, the temperature controller 218 may set the temperature of the laser module 204 to be offset from the reference temperature such that a frequency of a first modulation level (e.g., a the "1" modulation component) in the modulated optical waveform 206 is offset from a center of the particular passband region of the optical shaping filter 208, while remaining within the passband region. For example, in some implementations, the offset in frequency from the center of the particular passband region of the optical shaping filter 208 may be less than 5 GHz. In some implementations, the offset in frequency from the center of the passband region of the optical shaping filter 208 may be less than 1 GHz (or some other appropriate/specified offset).

Once the laser module 204 and the optical shaping filter 208 are aligned in the second wavelength channel, then as described above with reference to the first wavelength channel, to help ensure that the optical transmission system 200 remains tuned, in some implementations, the temperature controller 218 may further apply a temperature dither signal to the laser module 204 and perform re-alignment. In particular, the temperature controller 218 may measure, based on an updated filtered optical waveform 210 that is output from the optical shaping filter 208 after applying the temperature dither signal to the laser module 204, an updated average output power of the optical shaping filter 208. The temperature controller 218 may then adjust the temperature of the laser module 204 to a second temperature, within the second range of temperatures for the second wavelength channel, at which the updated average output power of the optical shaping filter 208 satisfies the same output criteria as described before.

As such, similar to the tuning process that was described above for the first wavelength channel, by monitoring the output of the optical shaping filter 208 and adjusting the temperature of the laser module 204 such that the output of the optical shaping filter 208 achieves specified output criteria in the manner described above, the optical transmission system 200 enables maintaining the optical transmission system to be tuned to achieve various performance enhancements, such as improved extinction ratio and diminished effects of frequency chirp.

This process described above of tuning the laser module 204 for different wavelength channels can be repeated for other wavelength channels in the system 200, by first adjusting the temperature of the laser module 204 to match a particular passband region of the optical shaping filter 208, and then performing further tuning operations, within the particular passband region, to better align the laser module 204 with frequency characteristics of the optical shaping filter 208 to achieved enhanced performance.

In some implementations, the system 200 may store, e.g., in computer memory, information regarding a historical record of the operating temperature of the laser module 204 for a given wavelength channel with time. In such scenarios, this information may be combined with information regarding the historical temperature difference between different channels, enabling the system 200 to efficiently performing tuning for different channels and thus accommodate aging in the laser and temperature control system. As such, when the multi-channel optical transmission system 200 switches between different channels, such information may be utilized by the system 200 to generate good estimates of the temperature adjustments that should be made in the laser module 204 to switch to a new channel, e.g., by summing the current temperature and the historical temperature difference between channels that has been recorded.

In some implementations, the system 200 may further be configured to mitigate against more severe instances of aging or drift by checking whether the original set of reference temperatures remains valid. In some scenarios, effects such as aging or drift may cause the system 200 to sufficiently deviate such that tuning algorithms, such as those described above, may converge on incorrect channels. As an example of such a scenario, the system 200 may be designed with a bandwidth separation between channels (e.g., 100 GHz) that corresponds to a relatively small channel-to-channel temperature difference between reference temperatures (e.g., about 7 degrees Celsius). In such scenarios, effects such as aging or drift may cause the laser module 204 to sufficiently deviate by more than a full channel separation, in which case a tuning algorithm may perform a search over an incorrect passband region.

To help mitigate against such difficulties, in some implementations, the system 200 may be configured to implement techniques to determine whether the set of reference temperatures remains valid. For example, the system 200 may control the temperature of the laser module 204 to sweep over a range of temperatures (e.g., between the highest reference temperature and the lowest reference temperature) corresponding to a particular range of frequencies (e.g., between the highest-frequency channel and the lowest-frequency channel). The system 200 may determine whether that range of temperatures (frequencies) includes a sufficient number of channels (e.g., four channels). As such, by checking to see whether a range of temperatures (frequencies) includes a sufficient number of channels, the system 200 may help ensure that the set of reference temperatures is correctly associated with the set of peak output powers from the optical shaping filter 208, and thus help further ensure proper tuning over time despite effects such as aging or drift.

Figure 3A:
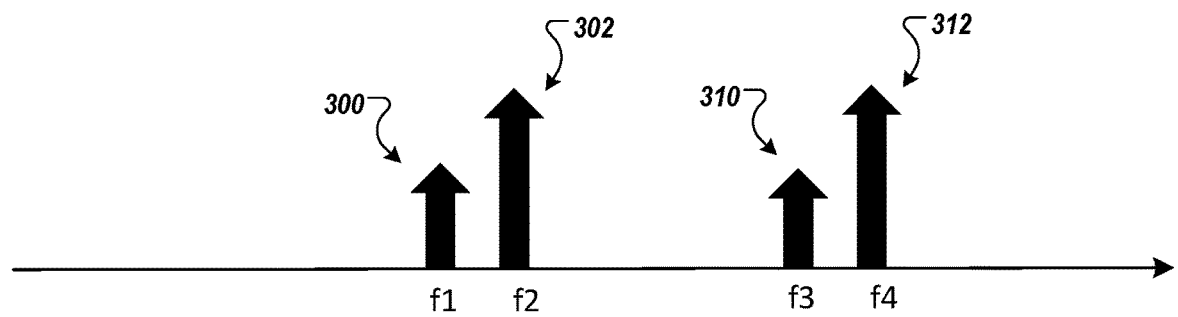
FIGS. 3A to 3C illustrate examples of aligning the frequency characteristics of a multiple bandpass optical shaping filter with outputs of a laser module for tuning a multi-channel optical transmission system.
Figure 3B:
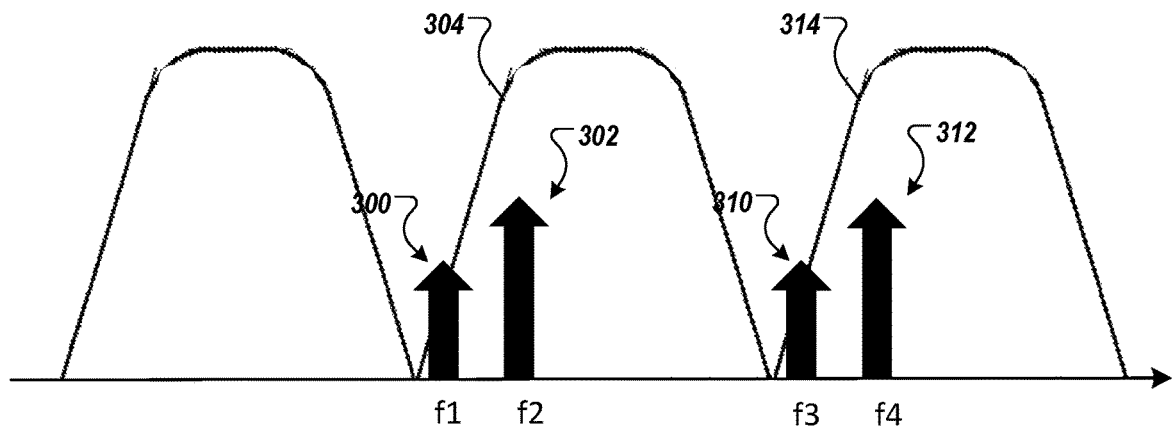
Figure 3C:
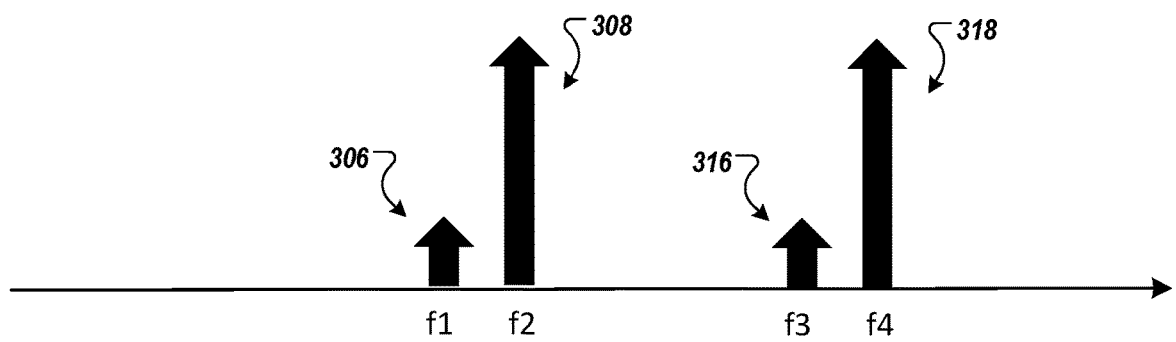

FIGS. 3A to 3C illustrate examples of aligning the frequency characteristics of an optical shaping filter (e.g., optical shaping filter 108 in FIG. 1 or 208 or FIG. 2) with outputs of a laser module (e.g., laser module 104 in FIG. 1 or 204 in FIG. 2) for tuning a multi-channel optical transmission system.

FIG. 3A illustrates outputs of a laser module (e.g., laser module 104 in FIG. 1 or 204 in FIG. 2) that correspond to two different channels at different center frequencies. Each channel includes two possible components of an output of an amplitude-modulated laser module that has incidental frequency modulation. In this example, the first channel includes a first modulation signal 300 and a second modulation signal 302 that are modulated at frequencies f1 and f2, and the second channel includes a first modulation signal 310 and a second modulation signal 312 that are modulated at frequencies f3 and f4. In each channel, the first modulation signals 300 and 310 represent a first modulation level (e.g., information "0" corresponding to a smaller amplitude) and the second modulation signals 302 and 312 represent a second modulation level (e.g., information "1" corresponding to a larger amplitude).

In addition to the amplitude modulation that distinguishes signal 300 from 302 in the first channel, and that distinguishes signal 310 from 312 in the second channel, non-ideal effects such as frequency chirp may additional cause incidental frequency modulation. Such frequency chirp may cause the different modulation signals in each channel to occupy different frequencies. For example, as shown in FIG. 3A, in the first channel, the first modulation signal 300 occupies a first frequency f1 and the second modulation signal 302 occupies a second frequency f2. Similarly, in the second channel, the first modulation signal 310 occupies a first frequency f3 and the second modulation signal 312 occupies a second frequency f4. Such differences in frequency components in a waveform caused by frequency chirp may be disadvantageous to communication systems.

FIG. 3B shows an example of mitigating such effects of frequency chirp by using an optical shaping filter (e.g., optical shaping filter 108 in FIG. 1 or 208 in FIG. 2). The optical shaping filter is configured to convert incidental frequency modulation (e.g., caused by chirp) in a modulated optical waveform into additional amplitude modulation that further enhances existing amplitude modulation in the modulated waveform.

As shown in FIG. 3B, in some implementations the frequency spectrum of the optical shaping filter includes two passband regions, denoted 304 and 314. Just as one example, in some implementations, each passband region may be a 7th order Bessel bandpass filter that has an attenuation of 3 dB at 6 GHz above or 6 GHz below a center frequency, and an attenuation of about 30 dB at 18 GHz below and 18 GHz above the center frequency. As another example, in some implementations, each passband region may be a 2nd-order bandpass filter with 20 GHz full-width half-maximum (FWHM). In general, the passband regions of the optical shaping filter may be implemented from among a wide variety of suitable bandpass characteristics. The passband regions of the optical shaping filter may be centered to correspond to different optical carrier frequencies, for example at 185 THz.

In the example of a 20 GHz FWHM 2nd order bandpass optical shaping filter, the filtering characteristics of each passband region may be equivalent to a 10 GHz lowpass filter centered about zero frequency (DC). In such scenarios, adding a pole at 10 GHz (e.g., to a 10 Gb transmitter) would shape the transmitted pulses in a somewhat rounded manner, but would not be a significant impairment.

The modulated signals 300 and 302 (for the first channel) and modulated signals 310 and 312 (for the second channel) that are output from the laser module (e.g., laser module 104 in FIG. 1) may be aligned with the passband regions 304 and 314 of the optical shaping filter. For example, the "1" frequencies f2 and f4 in the first and second channels may be aligned near the center of the passband regions 304 and 314, respectively. Then, due to presence of frequency chirp, the "0" frequencies f1 and f3 of the first and second channels will be moved a certain frequency distance away from the "1" frequencies. As an example, in FIG. 3B, the "0" frequencies f1 and f3 may be displaced 10 GHz below the "1" frequencies f2 and f4, respectively (e.g., 10 GHz of chirp).

Due to the filtering characteristic of the passband regions 304 and 314 of the optical shaping filter, the signals 300 and 310 at frequencies f1 and f3 are attenuated at the edge of the passband regions 304 and 314, while the signals 302 and 312 at frequencies f2 and f4 are enhanced near the center of the passband regions 304 and 314. As an example, for a 20 GHz FWHM optical shaping filter, the passband region 304 of the optical shaping filter would further enhance the amplitude distinction between signals 300 and 302 and, in this example, add another 3 dB to the extinction ratio for the first channel. Analogously, the second passband region 314 would further enhance the amplitude distinction between signals 310 and 312, and increase the extinction ratio for the second channel.

As another example, if there is 15 GHz of frequency chirp (so that f1 and f2 are separated by 15 GHz, and f3 and f4 are separated by 15 GHz), then the additional extinction ratio in the first and second channels provided by the optical shaping filter would be $$AER = 10\log\left(\left(\frac{fchirp}{f3dB}\right)^2 + 1\right) = 10\log\left(\left(\frac{15}{10}\right)^2 + 1\right) = 5.119 \text{ dB}$$

Laser operating frequency is typically proportional to the laser operating current, and therefore frequency chirp typically increases with the native extinction ratio that is generated by the laser. For example, driving a laser to about 5 dB of extinction ratio can generate 15 GHz of chirp. In such scenarios, an optical shaping filter can provide more than 10 dB of extinction ratio in each channel.

FIG. 3C shows an example of the resulting filtered optical waveform (e.g., filtered optical waveform 110 or 210 in FIG. 1 or 2). As shown, when the passband regions 304 and 314 of the optical shaping filter are properly aligned with the frequency modulation properties of a modulated signal (e.g., with frequencies f1 and f2, and with frequencies f3 and f4), then the resulting filtered optical waveform can have improved extinction ratio.

In some implementations, even higher extinction ratio enhancements may be achieved by aligning the "1" frequency (i.e., frequencies f2 and f4 in FIGS. 3A to 3C) a little below the center of the passband regions 304 and 314, respectively, of the optical shaping filter, as shown in FIG. 3B. Selecting the appropriate alignment of the frequency properties of a modulated waveform with an optical shaping filter will be discussed further below.

Such alignment between the modulation frequencies of a modulated waveform and an optical shaping filter can provide various advantages, such as: increasing average output power from the optical transmitter, increasing extinction ratio, increasing OMA, and/or mitigating effects of dispersion.

As a specific example, for a particular channel, the FWHM (full-width half-maximum) bandwidth, which is the distance in Hz between upper and lower 3 dB frequencies of the passband region of the optical shaping filter may be 20 GHz. The center of the passband region, denoted f0, may be 187.7 THz. The chirp frequency, fc, is equal to the difference between the frequency of "1"s and "0"s in an optical waveform. The frequency of the laser when outputting a "1" may be denoted as f1 (for purposes of the equations below). In this example, the following equations would apply:

$$MSR(f, fo, Q) := \frac{(f \cdot fo)^2}{[Q \cdot (fo^2 - f^2)]^2 + (f \cdot fo)^2}$$

Magnitude squared response of filter $$P0(Pavg, ERdB) := \frac{2 \cdot Pavg}{10^{\frac{ERdB}{10}} + 1}$$

$$P1(Pavg, ERdB) := P0(Pavg, ERdB) \cdot 10^{\frac{ERdB}{10}}$$

$$PavgOutDB(f1, fc, fo, Q, Pavg, ERdB) :=$$

$$10 \cdot \log\left(\frac{P0(Pavg, ERdB) \cdot MSR(f1 - fc, fo, Q) +}{P1(Pavg, ERdB) \cdot MSR(f1, fo, Q)}\right)$$

The equations above define the filter response, the power of a "0" signal, the power of a "1" signal, and the average output power in dB for a particular wavelength channel. In addition, the following equations define the OMA, the extinction ratio of the optical transmitter, and the extinction ratio enhancement (referred to as "contrast") provided by the optical shaping filter, and also defines the filter parameters for a particular passband region corresponding to the wavelength channel:

$$OMA(f1, fc, fo, Q, Pavg, ERdB) := P1(Pavg, ERdB) \cdot MSR(f1, fo, Q) -$$
$$P0(Pavg, ERdB) \cdot MSR(f1 - fc, fo, Q)$$

$$OMADB(f1, fc, fo, Q, ERdB) := 10 \cdot (OMA(f1, fc, fo, Q, Pavg, ERdB))$$

$$EROutDB(f1, fc, fo, Q, ERdB) :=$$
$$10 \cdot \log\left[\frac{(P1(1, ERdB) \cdot MSR(f1, fo, Q))}{(P0(1, ERdB) \cdot MSR(f1 - fc, fo, Q))}\right]$$

$$Contrast(f1, fc, fo, Q) := 10 \cdot \log\left(\frac{MSR(f1, fo, Q)}{MSR(f1 - fc, fo, Q)}\right)$$

$$Pavg := 5$$

$$fo := 187.7 \cdot 10^{12}$$

$$FWHM := 20 \cdot 10^9$$

$$Q := \frac{fo}{FWHM} = 9.385 \times 10^3$$

From the previous discussion, in some implementations, for a particular channel among multiple channels, tuning an optical transmission system may involve adjusting the temperature of a laser module (e.g., laser module 104 or 204 in FIG. 1 or 2) to find the maximum average output power from the optical shaping filter (e.g., optical shaping filters 108 or 208 in FIG. 1 or 2), and dithering the temperature of the laser module to assure that a desired maximum output power was achieved. In some implementations, that point may be provided by the zero derivative of average output power of a particular passband region of the optical shaping filter (Pout) versus temperature of the laser module (T). Changes in the temperature of the laser module (T) may correspond to changes in the frequency offset of a "1" modulation signal (e.g., signal 302 in FIG. 3) away from a center frequency of the particular passband region of the optical shaping filter. As such, the operating point may also be provided by the zero derivative of average output power of the optical shaping filter versus frequency offset, ΔPout/Δf.

Figure 4:
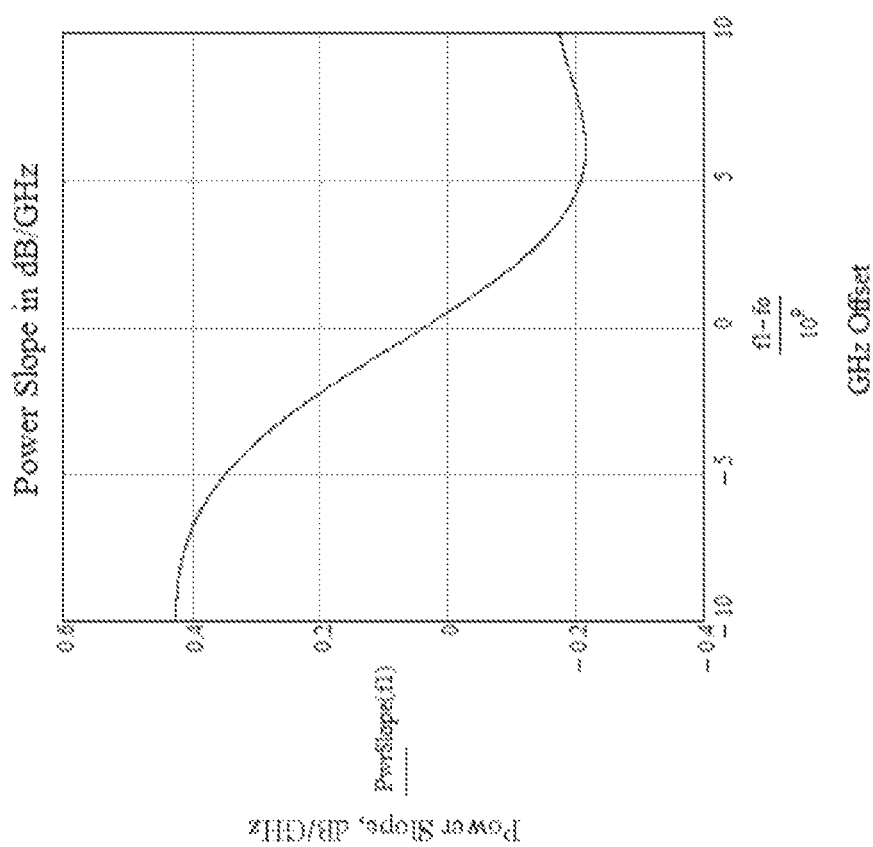
FIG. 4 is a graph showing an example of power slope as a function of the offset frequency in a system that tunes a multi-channel optical transmission system.

However, as shown in FIG. 4, in some implementations, it may be advantageous to implement the system where the slope ΔPout/Δf is slightly positive. FIG. 4 is a graph showing an example of power slope as a function of the offset frequency (in dB/GHz) in a system that tunes an optical transmission system. From this example, we see that the system could easily maintain a slope of 0.1 or 0.2 dB/GHz to stabilize the operating frequency, assuming that the filter's passband frequency changes slowly with time as compared to the laser's operating frequency. As such, a slight offset between a "1" modulation signal (e.g., signal 302 in FIG. 3) away from a center frequency of a passband region of the optical shaping filter may yield greater average output power from the optical shaping filter (e.g., optical shaping filter 208 in FIG. 2).

As such, the optical shaping filter takes advantage of frequency chirp to enhance the distinction between different amplitude levels in a modulated waveform, and thus increases the extinction ratio of the waveform.

As discussed above, the power-frequency relationship of FIG. 4 can be related to temperature changes of a laser module (e.g., laser module 204 in FIG. 2). For example, a typical laser may change frequency as a function of temperature at the rate of −100 GHz/7 C, or about −14 GHz/C. In such scenarios, maintaining a frequency within plus or minus 1 GHz would involve resolving the laser temperature to within 0.07 C. For example, if the desired slope is approximately 0.2 dB/GHz, and the df/dT=−1 GHz/0.07 C, then the ideal slope can be obtained by:

$$0.2 \frac{dB}{GHz} \cdot \frac{-1 \text{ GHz}}{0.07 \text{ C.}} = -2.86 \frac{dB}{C.}$$

As discussed with reference to FIGS. 2 and 3A to 3C, above, such tuning operations may be performed for each channel in a multi-channel optical transmission system. For example, switching between the different channels may be performed efficiently by adjusting the temperature of the laser module (e.g., laser module 104 or 204 in FIG. 1 or 2) to be within an appropriate range of temperatures corresponding to a selected wavelength channel. Further tuning may then be performed by fine-tuning the temperature of the laser module, as detailed above, within the range of temperatures for that selected wavelength channel, to achieve performance enhancements, such as improved extinction ratio and reduced effects of chirp.

Figure 5:
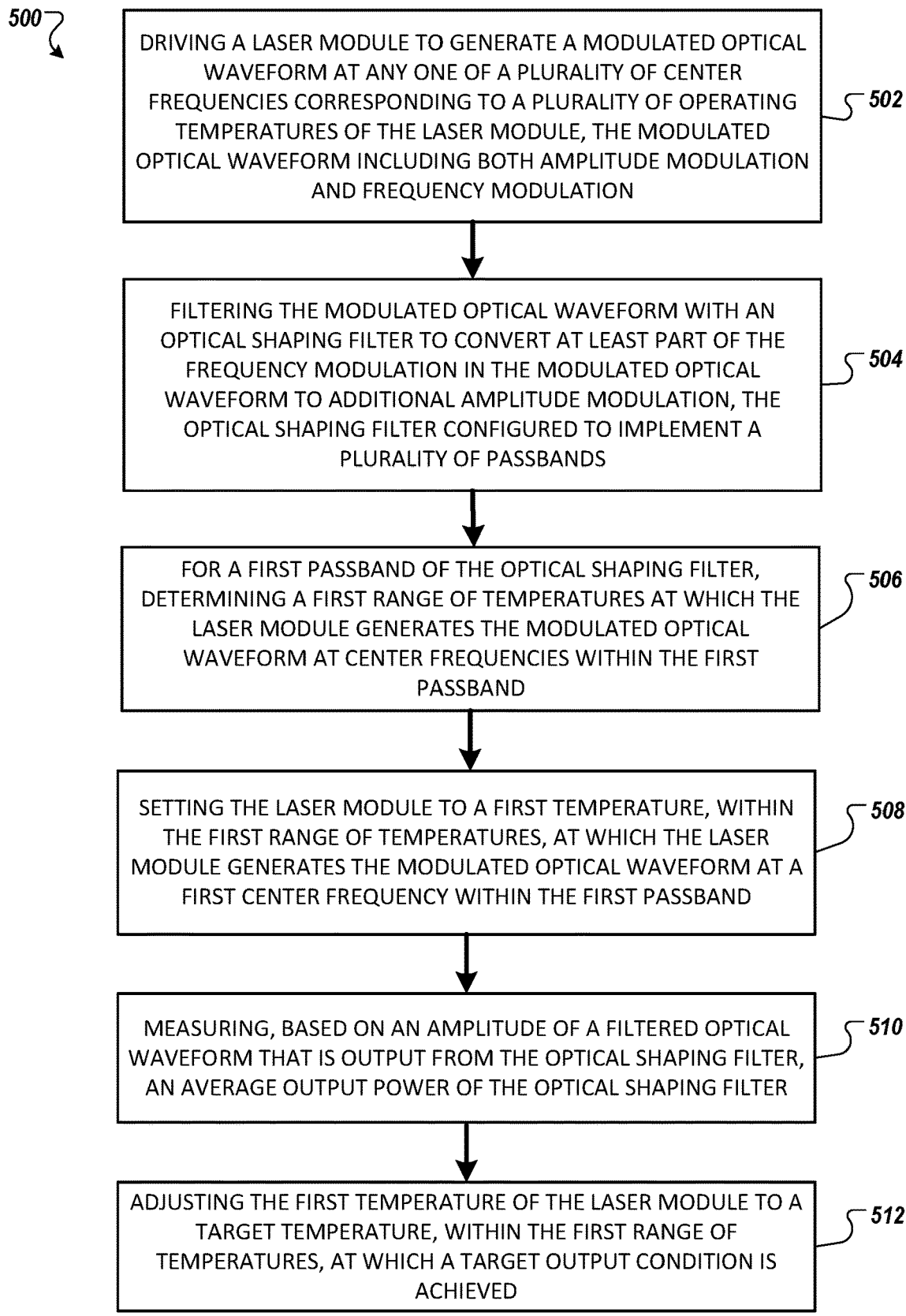
FIG. 5 is a flowchart illustrating an example method of tuning a multi-channel optical transmission system.

FIG. 5 is a flow chart of an example process 500 for enabling tuning of a multi-channel optical transmission system. Operations of the process 500 can be implemented, for example, using components of the optical transmission system, including a laser module and an optical shaping filter, as described above in FIGS. 1 and 2:

The tuning process 500 includes driving the laser module to generate a modulated optical waveform at any one of a plurality of center frequencies corresponding to a plurality of operating temperatures of the laser module, where the modulated optical waveform includes both amplitude modulation and frequency modulation (502). As discussed above, the modulated optical waveform may be an amplitude-modulated waveform with incidental frequency modulation that is caused by effects of frequency chirp.

The tuning process 500 further includes filtering the modulated optical waveform with the optical shaping filter to convert at least part of the frequency modulation in the modulated optical waveform to additional amplitude modulation for the modulated optical waveform, where the optical shaping filter is configured to implement a plurality of passbands corresponding to the plurality of center frequencies of the modulated optical waveform (504). The different passbands of the optical shaping filter may be configured as described with reference to FIGS. 3A to 3C, above. The optical shaping filter may be configured to convert incidental frequency modulation to additional amplitude modulation by aligning the modulation frequencies of the modulated optical waveform with at each center frequency with the corresponding passband of the optical shaping filter, as described with reference to FIGS. 3A to 3C, above.

The tuning process 500 further includes, for a first passband among the plurality of passbands of the optical shaping filter, determining a first range of temperatures at which the laser module generates the modulated optical waveform at center frequencies that are within the first passband (506).

The tuning process 500 further includes setting the laser module to a first temperature, within the first range of temperatures, at which the laser module generates the modulated optical waveform at a first center frequency that is within the first passband (508). Thus, as described above with reference to FIGS. 2 and 3A to 3C, switching between different channels is efficiently achieved by tuning the temperature of the laser module to an appropriate temperature range that corresponds to a selected passband of the optical shaping filter, thus reducing the need for moving parts that are often utilized to performing switching in multi-channel optical transmitters.

The tuning process 500 further includes measuring, based on an amplitude of a first filtered optical waveform that is output from the optical shaping filter, an average output power of the optical shaping filter (510).

The tuning process 500 further includes adjusting the first temperature of the laser module to a target temperature, within the first range of temperatures, at which a target output condition is achieved (512). In some implementations, adjusting the first temperature of the laser module to a target temperature at which the target output condition is achieved includes: (i) adjusting the first temperature of the laser module to a first target temperature, within the first range of temperatures, at which the average output power of the first filtered optical waveform that is output from the optical shaping filter satisfies a first output criteria, or (ii) adjusting the first temperature of the laser module to a second target temperature, within the first range of temperatures, at which the output power and extinction ratio of the first filtered optical waveform that is output from the optical shaping filter satisfy a second output criteria, based on a change in the average output power with center frequency.

In some implementations, the tuning process described above can be efficiently performed for different channels in the multi-channel optical transmission system. As an example, for a second passband among the plurality of passbands of the optical shaping filter, a second range of temperatures may be determined at which the laser module generates the modulated optical waveform at center frequencies that are within the second passband. The laser module may be adjusted from the first temperature to a second temperature, within the second range of temperatures, at which the laser module generates the modulated optical waveform at a second center frequency that is within the second passband. The tuning process may further include measuring, based on an amplitude of a second filtered optical waveform that is output from the optical shaping filter, an average output power of the optical shaping filter; and adjusting the second temperature of the laser module to a target temperature, within the second range of temperatures, at which the average output power of the second filtered optical waveform that is output from the optical shaping filter satisfies the target output condition. In some implementations, the target output condition may be the same as described above with reference to the first passband.

In some implementations, the adjustment of the temperature can include determining a reference temperature for the laser module, within the first range of temperatures, at which (i) the average output power of the optical shaping filter is maximized at a maximum average output power, or (ii) a specified extinction ratio is achieved and the average output power is within a specified amount of the maximum average output power. The reference temperature can be determined, for example, by determining, for a plurality of temperatures of the laser module within the first range of temperatures, a corresponding plurality of average output powers from the optical shaping filter; and selecting, from among the plurality of temperatures, the reference temperature as corresponding to (i) a maximum average output power among the plurality of average output powers, or (ii) an average output power among the plurality of average output powers that is within the specified amount of the maximum average output power, and at which the specified extinction ratio is achieved.

In some implementations, the temperature of the laser module can be set at an offset from the reference temperature, as discussed above. For example, the offset temperature can be a temperature at which a frequency of a first modulation level in the modulated optical waveform is less than 5 GHz (or some other appropriate amount) away from a center of a particular passband region, among the multiple passband regions, of the optical shaping filter.

In some implementations, the tuning process can include further operations. For example, the temperature of the laser module can be initialized to an initial temperature at which a particular center frequency, among the multiple center frequencies, of the laser module is aligned with a corresponding passband region, among the multiple passband regions, of the optical shaping filter. In some situations, a temperature dither signal can be applied to the laser module to offset the temperature of the laser module. Then, an updated average output power of the optical shaping filter can be measured for an updated filtered optical waveform that is output from the optical shaping filter. In turn, the temperature of the laser module can be adjusted to a an updated first temperature at which the updated average output power of the optical shaping filter satisfies the target output condition, so as to maintain the tuning of the laser module over time and changes in conditions.

Figure 6:
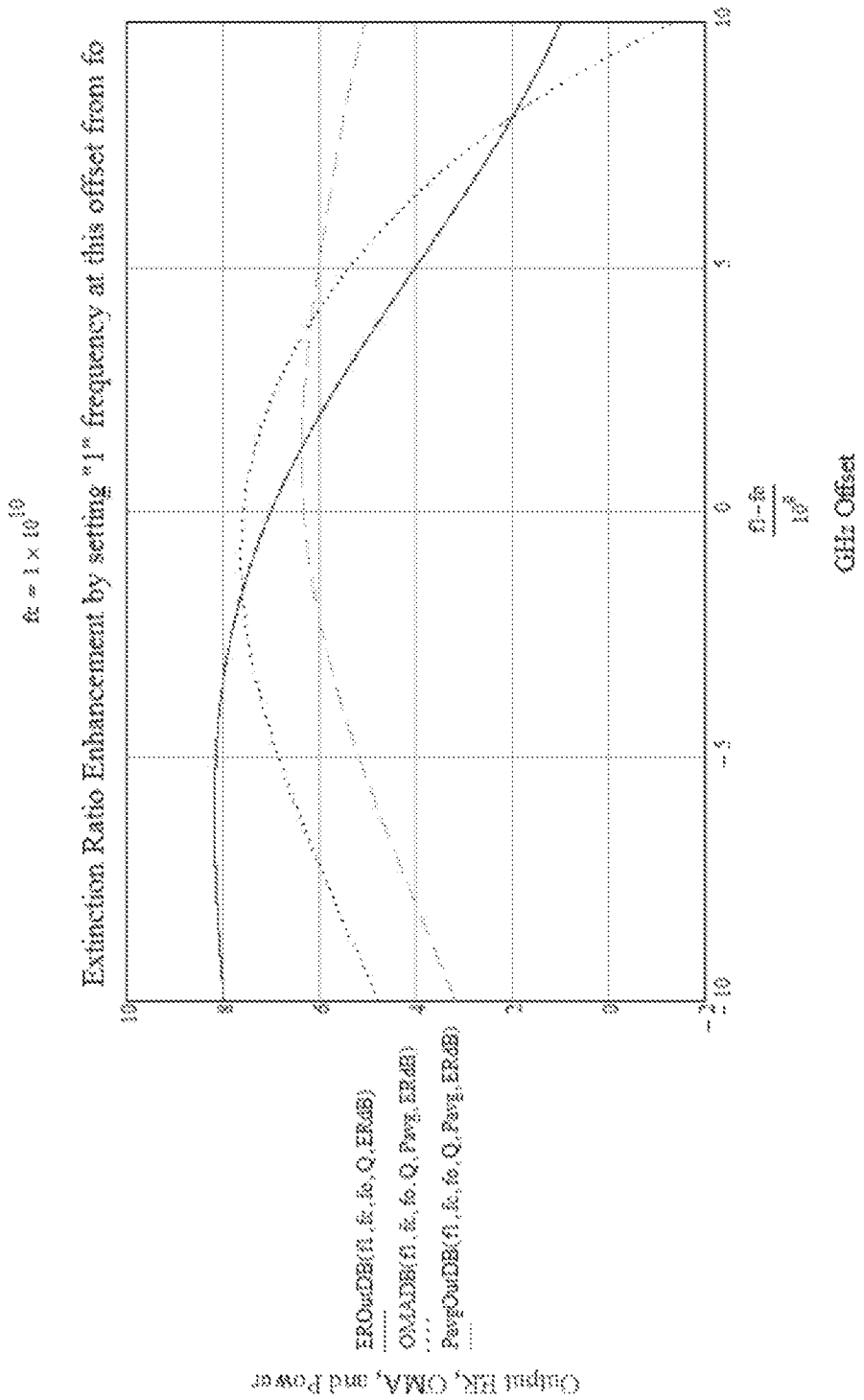
FIG. 6 is a graph showing an example of variations in extinction ratio as a function of offset frequency in a system that tunes a multi-channel optical transmission system.

FIG. 6 is a graph showing an example of variations in extinction ratio as a function of offset frequency in a system that tunes a multi-channel optical transmission system. As shown, in the scenario of 10 GHz of chirp and 4 dB of native extinction ratio in the laser, the optical shaping filter can provide up to 8.2 dB in extinction ratio for any given wavelength channel. To further increase extinction ratio at the output of the optical shaping filter, the native extinction ratio of the laser can be increased to increase the chirp to fc=14 GHz. As such, increased chirp (caused by higher native extinction ratio in the laser) can be leveraged by the optical shaping filter to enhance the extinction ratio in the transmitter optical waveform.

Figure 7:
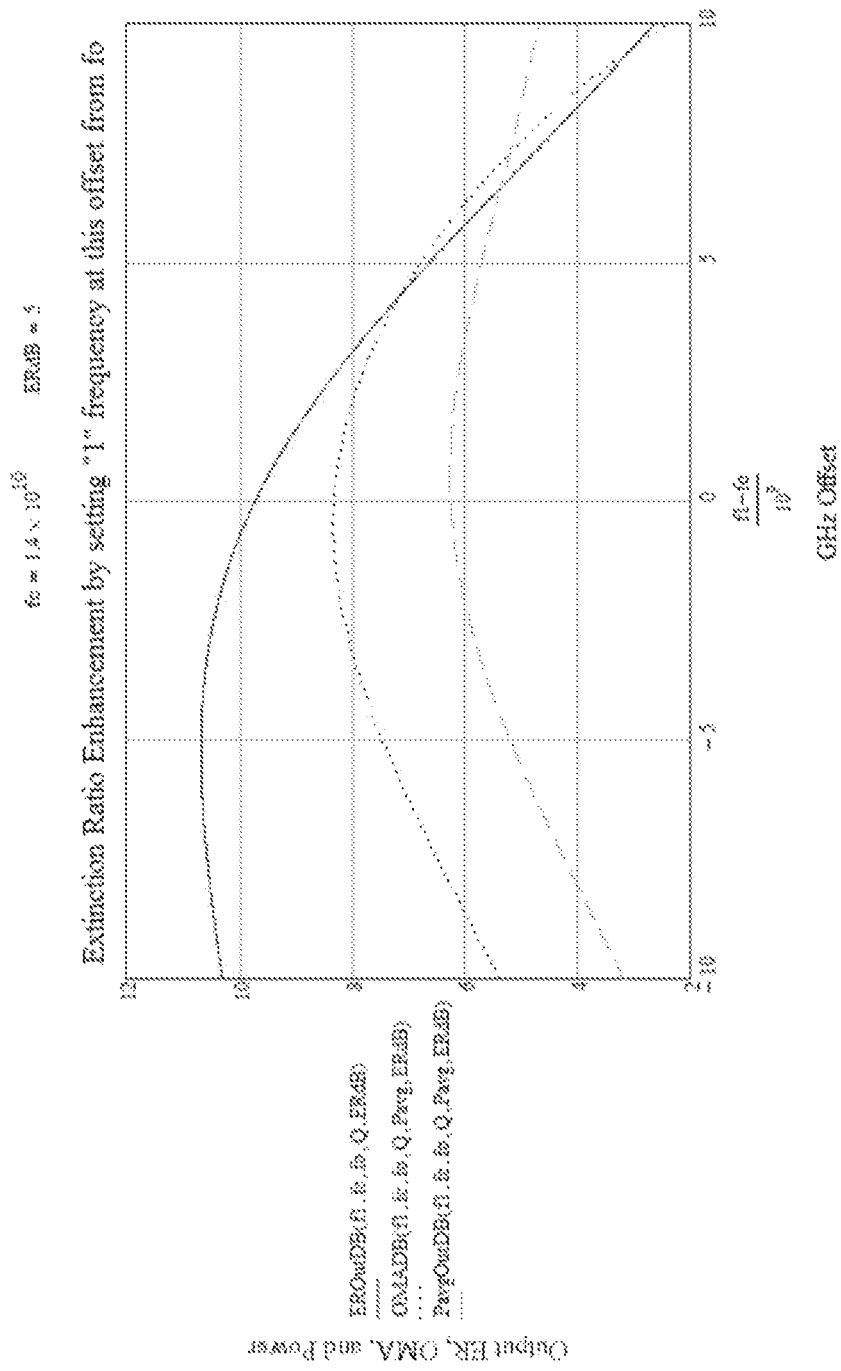
FIG. 7 is a graph showing another example of variations in extinction ratio as a function of offset frequency in a system that tunes a multi-channel optical transmission system.

FIG. 7 is a graph showing another example of variations in extinction ratio as a function of offset frequency in a system that tunes a multi-channel optical transmission system. In this example, the system can be designed to yield even higher extinction ratio enhancement. For example, given 14 GHz of chirp and 5 dB of native extinction ratio in the laser, the maximum OMA occurs at an offset of −0.46 GHz from the center of a particular passband region of the optical shaping filter. This also occurs just a little below where the average output power from the optical shaping filter is maximized, at an offset of −0.24 GHz. Both of these have at least 10 dB of enhanced extinction ratio provided by the optical shaping filter, illustrating that operating just below the maximum average output power point, for a given passband region, may be advantageous in some scenarios.

Figure 8:
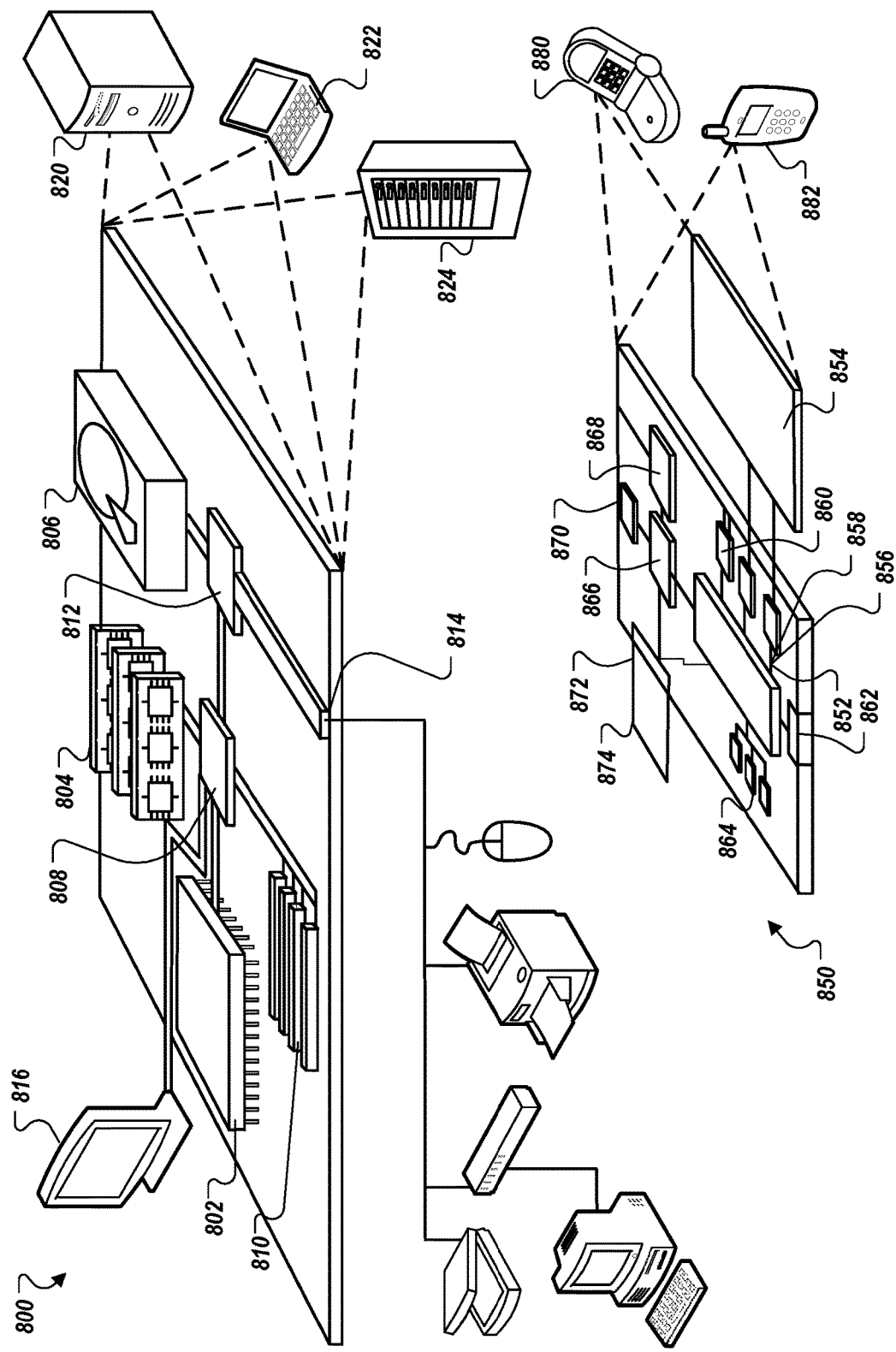
FIG. 8 is a diagram illustrating an example of a computing system that may be used to implement one or more components of a system that performs tuning for a multi-channel optical transmission system.

FIG. 8 is a diagram illustrating an example of a computing system 800 that may be used to implement one or more components of a system that performs tuning of a multi-channel optical transmission system.

The computing system includes computing device 800 and a mobile computing device 850 that can be used to implement the techniques described herein. For example, one or more parts of the optical communication environment 100 in FIG. 1 could be an example of the system 800 described here, such as a computer system, devices that access information, or a server that accesses or stores information.

The computing device 800 is intended to represent various forms of digital computers, such as laptops, desktops, workstations, personal digital assistants, servers, blade servers, mainframes, and other appropriate computers. The mobile computing device 850 is intended to represent various forms of mobile devices, such as personal digital assistants, cellular telephones, smart-phones, mobile embedded radio systems, radio diagnostic computing devices, and other similar computing devices. The components shown here, their connections and relationships, and their functions, are meant to be examples only, and are not meant to be limiting.

The computing device 800 includes a processor 802, a memory 804, a storage device 806, a high-speed interface 808 connecting to the memory 804 and multiple high-speed expansion ports 810, and a low-speed interface 812 connecting to a low-speed expansion port 814 and the storage device 806. Each of the processor 802, the memory 804, the storage device 806, the high-speed interface 808, the high-speed expansion ports 810, and the low-speed interface 812, are interconnected using various busses, and may be mounted on a common motherboard or in other manners as appropriate. The processor 802 can process instructions for execution within the computing device 800, including instructions stored in the memory 804 or on the storage device 806 to display graphical information for a GUI on an external input/output device, such as a display 816 coupled to the high-speed interface 808. In other implementations, multiple processors and/or multiple buses may be used, as appropriate, along with multiple memories and types of memory. In addition, multiple computing devices may be connected, with each device providing portions of the operations (e.g., as a server bank, a group of blade servers, or a multi-processor system). In some implementations, the processor 802 is a single-threaded processor. In some implementations, the processor 802 is a multi-threaded processor. In some implementations, the processor 802 is a quantum computer.

The memory 804 stores information within the computing device 800. In some implementations, the memory 804 is a volatile memory unit or units. In some implementations, the memory 804 is a non-volatile memory unit or units. The memory 804 may also be another form of computer-readable medium, such as a magnetic or optical disk.

The storage device 806 is capable of providing mass storage for the computing device 800. In some implementations, the storage device 806 may be or include a computer-readable medium, such as a floppy disk device, a hard disk device, an optical disk device, or a tape device, a flash memory or other similar solid-state memory device, or an array of devices, including devices in a storage area network or other configurations. Instructions can be stored in an information carrier. The instructions, when executed by one or more processing devices (for example, processor 802), perform one or more methods, such as those described above. The instructions can also be stored by one or more storage devices such as computer- or machine-readable mediums (for example, the memory 804, the storage device 806, or memory on the processor 802). The high-speed interface 808 manages bandwidth-intensive operations for the computing device 800, while the low-speed interface 812 manages lower bandwidth-intensive operations. Such allocation of functions is an example only. In some implementations, the high-speed interface 808 is coupled to the memory 804, the display 816 (e.g., through a graphics processor or accelerator), and to the high-speed expansion ports 810, which may accept various expansion cards (not shown). In the implementation, the low-speed interface 812 is coupled to the storage device 806 and the low-speed expansion port 814. The low-speed expansion port 814, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 800 may be implemented in a number of different forms, as shown in the figure. For example, it may be implemented as a standard server 820, or multiple times in a group of such servers. In addition, it may be implemented in a personal computer such as a laptop computer 822. It may also be implemented as part of a rack server system 824. Alternatively, components from the computing device 800 may be combined with other components in a mobile device (not shown), such as a mobile computing device 850. Each of such devices may include one or more of the computing device 800 and the mobile computing device 850, and an entire system may be made up of multiple computing devices communicating with each other.

The mobile computing device 850 includes a processor 852, a memory 864, an input/output device such as a display 854, a communication interface 866, and a transceiver 868, among other components. The mobile computing device 850 may also be provided with a storage device, such as a micro-drive or other device, to provide additional storage. Each of the processor 852, the memory 864, the display 854, the communication interface 866, and the transceiver 868, are interconnected using various buses, and several of the components may be mounted on a common motherboard or in other manners as appropriate.

The processor 852 can execute instructions within the mobile computing device 850, including instructions stored in the memory 864. The processor 852 may be implemented as a chip set of chips that include separate and multiple analog and digital processors. The processor 852 may provide, for example, for coordination of the other components of the mobile computing device 850, such as control of user interfaces, applications run by the mobile computing device 850, and wireless communication by the mobile computing device 850.

The processor 852 may communicate with a user through a control interface 858 and a display interface 856 coupled to the display 854. The display 854 may be, for example, a TFT (Thin-Film-Transistor Liquid Crystal Display) display or an OLED (Organic Light Emitting Diode) display, or other appropriate display technology. The display interface 856 may include appropriate circuitry for driving the display 854 to present graphical and other information to a user. The control interface 858 may receive commands from a user and convert them for submission to the processor 852. In addition, an external interface 862 may provide communication with the processor 852, so as to enable near area communication of the mobile computing device 850 with other devices. The external interface 862 may provide, for example, for wired communication in some implementations, or for wireless communication in other implementations, and multiple interfaces may also be used.

The memory 864 stores information within the mobile computing device 850. The memory 864 can be implemented as one or more of a computer-readable medium or media, a volatile memory unit or units, or a non-volatile memory unit or units. An expansion memory 874 may also be provided and connected to the mobile computing device 850 through an expansion interface 872, which may include, for example, a SIMM (Single In Line Memory Module) card interface. The expansion memory 874 may provide extra storage space for the mobile computing device 850, or may also store applications or other information for the mobile computing device 850. Specifically, the expansion memory 874 may include instructions to carry out or supplement the processes described above, and may include secure information also. Thus, for example, the expansion memory 874 may be provide as a security module for the mobile computing device 850, and may be programmed with instructions that permit secure use of the mobile computing device 850. In addition, secure applications may be provided via the SIMM cards, along with additional information, such as placing identifying information on the SIMM card in a non-hackable manner.

The memory may include, for example, flash memory and/or NVRAM memory (non-volatile random access memory), as discussed below. In some implementations, instructions are stored in an information carrier such that the instructions, when executed by one or more processing devices (for example, processor 852), perform one or more methods, such as those described above. The instructions can also be stored by one or more storage devices, such as one or more computer- or machine-readable mediums (for example, the memory 864, the expansion memory 874, or memory on the processor 852). In some implementations, the instructions can be received in a propagated signal, for example, over the transceiver 868 or the external interface 862.

The mobile computing device 850 may communicate wirelessly through the communication interface 866, which may include digital signal processing circuitry where necessary. The communication interface 866 may provide for communications under various modes or protocols, such as GSM voice calls (Global System for Mobile communications), SMS (Short Message Service), EMS (Enhanced Messaging Service), or MMS messaging (Multimedia Messaging Service), CDMA (code division multiple access), TDMA (time division multiple access), PDC (Personal Digital Cellular), WCDMA (Wideband Code Division Multiple Access), CDMA2000, or GPRS (General Packet Radio Service), LTE, 5G/6G cellular, among others. Such communication may occur, for example, through the transceiver 868 using a radio frequency. In addition, short-range communication may occur, such as using a Bluetooth, Wi-Fi, or other such transceiver (not shown). In addition, a GPS (Global Positioning System) receiver module 870 may provide additional navigation- and location-related wireless data to the mobile computing device 850, which may be used as appropriate by applications running on the mobile computing device 850.

The mobile computing device 850 may also communicate audibly using an audio codec 860, which may receive spoken information from a user and convert it to usable digital information. The audio codec 860 may likewise generate audible sound for a user, such as through a speaker, e.g., in a handset of the mobile computing device 850. Such sound may include sound from voice telephone calls, may include recorded sound (e.g., voice messages, music files, etc.) and may also include sound generated by applications operating on the mobile computing device 850.

The mobile computing device 850 may be implemented in a number of different forms, as shown in the figure. For example, it may be implemented as a cellular telephone 880. It may also be implemented as part of a smart-phone 882, personal digital assistant, or other similar mobile device.

The term "system" as used in this disclosure may encompass all apparatus, devices, and machines for processing data, including by way of example a programmable processor, a computer, or multiple processors or computers. A processing system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, executable logic, or code) can be written in any form of programming language, including compiled or interpreted languages, or declarative or procedural languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

Computer readable media suitable for storing computer program instructions and data include all forms of non-volatile or volatile memory, media and memory devices, including by way of example semiconductor memory devices, e.g., EPROM, EEPROM, and flash memory devices; magnetic disks, e.g., internal hard disks or removable disks or magnetic tapes; magneto optical disks; and CD-ROM and DVD-ROM disks. The processor and the memory can be supplemented by, or incorporated in, special purpose logic circuitry. Sometimes a server is a general-purpose computer, and sometimes it is a custom-tailored special purpose electronic device, and sometimes it is a combination of these things.

Implementations can include a back end component, e.g., a data server, or a middleware component, e.g., an application server, or a front end component, e.g., a client computer having a graphical user interface or a Web browser through which a user can interact with an implementation of the subject matter described is this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The features described can be implemented in digital electronic circuitry, or in computer hardware, firmware, software, or in combinations of them. The apparatus can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

While this disclosure contains many specific implementation details, these should not be construed as limitations on the scope of any invention or of what may be claimed, but rather as descriptions of features that may be specific to particular implementations of particular inventions. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

What is claimed is:

1. An optical transmission system comprising:
a laser module configured to generate a modulated optical waveform at any one of a plurality of center frequencies corresponding to a plurality of operating temperatures of the laser module, the modulated optical waveform comprising both amplitude modulation and frequency modulation;
an optical shaping filter that is configured to implement a plurality of passbands corresponding to the center frequencies of the modulated optical waveform, and that is configured to convert at least part of the frequency modulation in the modulated optical waveform to additional amplitude modulation for the modulated optical waveform; and
a controller comprising at least one processor configured to tune the optical transmission system by performing operations that comprise:
for a first passband among the plurality of passbands of the optical shaping filter, determining a first range of temperatures at which the laser module generates the modulated optical waveform at center frequencies that are within the first passband;
setting the laser module to a first temperature, within the first range of temperatures, at which the laser module generates the modulated optical waveform at a first center frequency that is within the first passband;
measuring, based on an amplitude of a first filtered optical waveform that is output from the optical shaping filter, an average output power of the optical shaping filter; and
adjusting the first temperature of the laser module to a target temperature, within the first range of temperatures, at which a target output condition is achieved, comprising:
adjusting the first temperature of the laser module to a first target temperature, within the first range of temperatures, at which the average output power of the first filtered optical waveform that is output from the optical shaping filter satisfies a first output criteria, or
adjusting the first temperature of the laser module to a second target temperature, within the first range of temperatures, at which the output power and extinction ratio of the first filtered optical waveform that is output from the optical shaping filter satisfy a second output criteria, wherein adjusting the first temperature of the laser module to the target temperature, within the first range of temperatures, at which the target output condition is achieved comprises:
determining a reference temperature for the laser module, within the first range of temperatures, at which (i) the average output power of the optical shaping filter is maximized at a maximum average output power, or (ii) a specified extinction ratio is achieved and the average output power is within a specified amount of the maximum average output power, and wherein determining the reference temperature for the laser module, within the first range of temperatures, at which the average output power of the optical shaping filter is maximized comprises:
determining, for a plurality of temperatures of the laser module within the first range of temperatures, a corresponding plurality of average output powers from the optical shaping filter; and
selecting, from among the plurality of temperatures, the reference temperature as corresponding to (i) a maximum average output power among the plurality of average output powers, or (ii) an average output power among the plurality of average output powers that is within the specified amount of the maximum average output power, and at which the specified extinction ratio is achieved.

2. The optical transmission system of claim 1, wherein the operations further comprise:
setting the first temperature of the laser module to be offset from the reference temperature such that a modulation frequency of a first modulation level in the modulated optical waveform is less than 5 GHz away from a center of the first passband of the optical shaping filter.

3. An optical transmission system comprising:
a laser module configured to generate a modulated optical waveform at any one of a plurality of center frequencies corresponding to a plurality of operating temperatures of the laser module, the modulated optical waveform comprising both amplitude modulation and frequency modulation;
an optical shaping filter that is configured to implement a plurality of passbands corresponding to the center frequencies of the modulated optical waveform, and that is configured to convert at least part of the frequency modulation in the modulated optical waveform to additional amplitude modulation for the modulated optical waveform; and
a controller comprising at least one processor configured to tune the optical transmission system by performing operations that comprise:
for a first passband among the plurality of passbands of the optical shaping filter, determining a first range of temperatures at which the laser module generates the modulated optical waveform at center frequencies that are within the first passband;
setting the laser module to a first temperature, within the first range of temperatures, at which the laser module generates the modulated optical waveform at a first center frequency that is within the first passband;
measuring, based on an amplitude of a first filtered optical waveform that is output from the optical shaping filter, an average output power of the optical shaping filter;
adjusting the first temperature of the laser module to a target temperature, within the first range of temperatures, at which a target output condition is achieved, comprising:
adjusting the first temperature of the laser module to a first target temperature, within the first range of temperatures, at which the average output power of the first filtered optical waveform that is output from the optical shaping filter satisfies a first output criteria, or
adjusting the first temperature of the laser module to a second target temperature, within the first range of temperatures, at which the output power and extinction ratio of the first filtered optical waveform that is output from the optical shaping filter satisfy a second output criteria;
based on adjusting the first temperature of the laser module to the target temperature, within the first range of temperatures, at which the target output condition is achieved, further applying a temperature dither signal to the laser module to offset the first temperature of the laser module;
measuring, based on an updated first filtered optical waveform that is output from the optical shaping filter, an updated average output power of the optical shaping filter; and
adjusting the first temperature of the laser module to an updated first temperature at which the updated average output power of the optical shaping filter satisfies the target output condition.

4. The optical transmission system of claim 3, wherein the operations further comprise:
for a second passband among the plurality of passbands of the optical shaping filter, determining a second range of temperatures at which the laser module generates the modulated optical waveform at center frequencies that are within the second passband;
adjusting the laser module from the first temperature to a second temperature, within the second range of temperatures, at which the laser module generates the modulated optical waveform at a second center frequency that is within the second passband;
measuring, based on an amplitude of a second filtered optical waveform that is output from the optical shaping filter, an average output power of the optical shaping filter; and
adjusting the second temperature of the laser module to a target temperature, within the second range of temperatures, at which the average output power of the second filtered optical waveform that is output from the optical shaping filter satisfies the target output condition.

5. The optical transmission system of claim 3, wherein the laser module comprises a directly modulated laser that is tunable over a range of frequencies that comprises the plurality of passbands of the optical shaping filter, and
wherein the optical shaping filter is a bandpass filter configured to limit an operating bandwidth of the modulated optical waveform.

6. The optical transmission system of claim 5, wherein the optical transmission system further comprises a transmitter that is configured to modulate an electrical signal that drives the laser module to generate the modulated optical waveform.

7. The optical transmission system of claim 3, wherein adjusting the first temperature of the laser module to the first target temperature or to the second target temperature comprises:
determining a rate of change of the output power with respect to the first center frequency or with respect to the first temperature of the laser module; and
adjusting the first temperature of the laser module to the first target temperature or to the second target temperature at which the rate of change of the output power satisfies a first condition or a second condition, respectively.

8. The optical transmission system of claim 3, wherein adjusting the first temperature of the laser module to the target temperature, within the first range of temperatures, at which the target output condition is achieved comprises:
determining a reference temperature for the laser module, within the first range of temperatures, at which (i) the average output power of the optical shaping filter is maximized at a maximum average output power, or (ii) a specified extinction ratio is achieved and the average output power is within a specified amount of the maximum average output power.

9. The optical transmission system of claim 3, wherein the laser module is further configured to generate the modulated optical waveform having a first modulation frequency and a second modulation frequency, and
wherein the operations further comprise:
initializing the temperature of the laser module to an initial temperature at which the first modulation frequency of the laser module is aligned with the optical shaping filter, based on a center frequency of the first passband of the optical shaping filter.

10. A method of tuning an optical transmission system that comprises a laser module and an optical shaping filter, the method comprising:
driving the laser module to generate a modulated optical waveform at any one of a plurality of center frequencies corresponding to a plurality of operating temperatures of the laser module, the modulated optical waveform comprising both amplitude modulation and frequency modulation;

filtering the modulated optical waveform with the optical shaping filter to convert at least part of the frequency modulation in the modulated optical waveform to additional amplitude modulation for the modulated optical waveform, the optical shaping filter configured to implement a plurality of passbands corresponding to the plurality of center frequencies of the modulated optical waveform;

for a first passband among the plurality of passbands of the optical shaping filter, determining a first range of temperatures at which the laser module generates the modulated optical waveform at center frequencies that are within the first passband;

setting the laser module to a first temperature, within the first range of temperatures, at which the laser module generates the modulated optical waveform at a first center frequency that is within the first passband;

measuring, based on an amplitude of a first filtered optical waveform that is output from the optical shaping filter, an average output power of the optical shaping filter; and adjusting the first temperature of the laser module to a target temperature, within the first range of temperatures, at which a target output condition is achieved, comprising:
  adjusting the first temperature of the laser module to a first target temperature, within the first range of temperatures, at which the average output power of the first filtered optical waveform that is output from the optical shaping filter satisfies a first output criteria, or
  adjusting the first temperature of the laser module to a second target temperature, within the first range of temperatures, at which the output power and extinction ratio of the first filtered optical waveform that is output from the optical shaping filter satisfy a second output criteria, wherein adjusting the first temperature of the laser module to the target temperature, within the first range of temperatures, at which the target output condition is achieved comprises:
    determining a reference temperature for the laser module, within the first range of temperatures, at which (i) the average output power of the optical shaping filter is maximized at a maximum average output power, or (ii) a specified extinction ratio is achieved and the average output power is within a specified amount of the maximum average output power, and wherein determining the reference temperature for the laser module, within the first range of temperatures, at which the average output power of the optical shaping filter is maximized comprises:
      determining, for a plurality of temperatures of the laser module within the first range of temperatures, a corresponding plurality of average output powers from the optical shaping filter; and
      selecting, from among the plurality of temperatures, the reference temperature as corresponding to (i) a maximum average output power among the plurality of average output powers, or (ii) an average output power among the plurality of average output powers that is within the specified amount of the maximum average output power, and at which the specified extinction ratio is achieved.

11. The method of claim 10, further comprising:
setting the first temperature of the laser module to be offset from the reference temperature such that a modulation frequency of a first modulation level in the modulated optical waveform is less than 5 GHz away from a center of the first passband of the optical shaping filter.

12. A method of tuning an optical transmission system that comprises a laser module and an optical shaping filter, the method comprising:
driving the laser module to generate a modulated optical waveform at any one of a plurality of center frequencies corresponding to a plurality of operating temperatures of the laser module, the modulated optical waveform comprising both amplitude modulation and frequency modulation;

filtering the modulated optical waveform with the optical shaping filter to convert at least part of the frequency modulation in the modulated optical waveform to additional amplitude modulation for the modulated optical waveform, the optical shaping filter configured to implement a plurality of passbands corresponding to the plurality of center frequencies of the modulated optical waveform;

for a first passband among the plurality of passbands of the optical shaping filter, determining a first range of temperatures at which the laser module generates the modulated optical waveform at center frequencies that are within the first passband;

setting the laser module to a first temperature, within the first range of temperatures, at which the laser module generates the modulated optical waveform at a first center frequency that is within the first passband;

measuring, based on an amplitude of a first filtered optical waveform that is output from the optical shaping filter, an average output power of the optical shaping filter;

adjusting the first temperature of the laser module to a target temperature, within the first range of temperatures, at which a target output condition is achieved, comprising:
  adjusting the first temperature of the laser module to a first target temperature, within the first range of temperatures, at which the average output power of the first filtered optical waveform that is output from the optical shaping filter satisfies a first output criteria, or
  adjusting the first temperature of the laser module to a second target temperature, within the first range of temperatures, at which the output power and extinction ratio of the first filtered optical waveform that is output from the optical shaping filter satisfy a second output criteria;

based on adjusting the first temperature of the laser module to the target temperature, within the first range of temperatures, at which the target output condition is achieved, further applying a temperature dither signal to the laser module to offset the first temperature of the laser module;

measuring, based on an updated first filtered optical waveform that is output from the optical shaping filter, an updated average output power of the optical shaping filter; and adjusting the first temperature of the laser module to an updated first temperature at which the updated average output power of the optical shaping filter satisfies the target output condition.

13. The method of claim 12, further comprising:
for a second passband among the plurality of passbands of the optical shaping filter, determining a second range of temperatures at which the laser module generates the modulated optical waveform at center frequencies that are within the second passband;
adjusting the laser module from the first temperature to a second temperature, within the second range of temperatures, at which the laser module generates the modulated optical waveform at a second center frequency that is within the second passband;
measuring, based on an amplitude of a second filtered optical waveform that is output from the optical shaping filter, an average output power of the optical shaping filter; and
adjusting the second temperature of the laser module to a target temperature, within the second range of temperatures, at which the average output power of the second filtered optical waveform that is output from the optical shaping filter satisfies the target output condition.

14. The method of claim 12, wherein the laser module comprises a directly modulated laser that is tunable over a range of frequencies that comprises the plurality of passbands of the optical shaping filter, and
wherein the optical shaping filter is a bandpass filter configured to limit an operating bandwidth of the modulated optical waveform.

15. The method of claim 14, wherein the optical transmission system further comprises a transmitter that is configured to modulate an electrical signal that drives the laser module to generate the modulated optical waveform.

16. The method of claim 12, wherein adjusting the first temperature of the laser module to the first target temperature or to the second target temperature comprises:
determining a rate of change of the output power with respect to the first center frequency or with respect to the first temperature of the laser module; and
adjusting the first temperature of the laser module to the first target temperature or to the second target temperature at which the rate of change of the output power satisfies a first condition or a second condition, respectively.

17. The method of claim 12, wherein adjusting the first temperature of the laser module to the target temperature, within the first range of temperatures, at which the target output condition is achieved comprises:
determining a reference temperature for the laser module, within the first range of temperatures, at which (i) the average output power of the optical shaping filter is maximized at a maximum average output power, or (ii) a specified extinction ratio is achieved and the average output power is within a specified amount of the maximum average output power.

18. The method of claim 12, wherein the laser module is further configured to generate the modulated optical waveform having a first modulation frequency and a second modulation frequency, and wherein the operations further comprise:
initializing the temperature of the laser module to an initial temperature at which the first modulation frequency of the laser module is aligned with the optical shaping filter, based on a center frequency of the first passband of the optical shaping filter.

* * * * *